US011201089B2

(12) United States Patent
Niimi et al.

(10) Patent No.: US 11,201,089 B2
(45) Date of Patent: Dec. 14, 2021

(54) ROBUST LOW-K BOTTOM SPACER FOR VFET

(71) Applicant: INTERNATIONAL BUSINESS MACHINES CORPORATION, Armonk, NY (US)

(72) Inventors: Hiroaki Niimi, Cahoes, NY (US); Pietro Montanini, Albany, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/289,903

(22) Filed: Mar. 1, 2019

(65) Prior Publication Data

US 2020/0279780 A1 Sep. 3, 2020

(51) Int. Cl.
| H01L 21/8234 | (2006.01) |
| H01L 29/78 | (2006.01) |
| H01L 27/088 | (2006.01) |
| H01L 21/768 | (2006.01) |
| H01L 29/66 | (2006.01) |

(52) U.S. Cl.
CPC ........ *H01L 21/823468* (2013.01); *H01L 21/76832* (2013.01); *H01L 21/823481* (2013.01); *H01L 21/823487* (2013.01); *H01L 27/088* (2013.01); *H01L 29/6653* (2013.01); *H01L 29/66666* (2013.01); *H01L 29/7827* (2013.01)

(58) Field of Classification Search
CPC ..... H01L 21/823468; H01L 21/823481; H01L 21/823487; H01L 29/6653; H01L 29/66666; H01L 29/7827; H01L 21/76832; H01L 27/088
See application file for complete search history.

(56) References Cited

U.S. PATENT DOCUMENTS

| 9,245,885 | B1 | 1/2016 | Xie et al. |
| 9,368,572 | B1 | 6/2016 | Cheng et al. |
| 9,437,503 | B1 | 9/2016 | Mallela et al. |
| 9,627,511 | B1 | 4/2017 | Cheng et al. |
| 9,716,170 | B1 | 7/2017 | Cheng et al. |
| 9,761,728 | B1 | 9/2017 | Cheng et al. |
| 9,780,191 | B2 | 10/2017 | Posseme |
| 9,799,749 | B1 * | 10/2017 | Bi ................... H01L 29/7827 |
| 9,825,032 | B1 * | 11/2017 | Bentley ............ H01L 29/41791 |
| 9,853,028 | B1 | 12/2017 | Cheng et al. |
| 9,899,515 | B1 * | 2/2018 | Cheng ............... H01L 29/41741 |

(Continued)

*Primary Examiner* — Matthew L Reames
*Assistant Examiner* — Christopher M Roland
(74) *Attorney, Agent, or Firm* — Cantor Colburn LLP; Joseph Petrokaitis

(57) ABSTRACT

Embodiments of the present invention are directed to techniques for forming a robust low-k bottom spacer for a vertical field effect transistor (VFET) using a spacer first, shallow trench isolation last process integration. In a non-limiting embodiment of the invention, a semiconductor fin is formed over a substrate. A first dielectric liner is formed on a sidewall of the semiconductor fin. A bottom spacer is formed over the substrate and on a sidewall of the first dielectric liner. The first dielectric liner is positioned between the semiconductor fin and the bottom spacer. Portions of the bottom spacer are removed to define a shallow trench isolation region.

3 Claims, 28 Drawing Sheets

(56) References Cited

U.S. PATENT DOCUMENTS

| | | | |
|---|---|---|---|
| 9,972,494 B1 | 5/2018 | Bentley et al. | |
| 10,157,794 B1* | 12/2018 | Suvarna | H01L 29/7827 |
| 2017/0229558 A1* | 8/2017 | Anderson | H01L 21/308 |

* cited by examiner

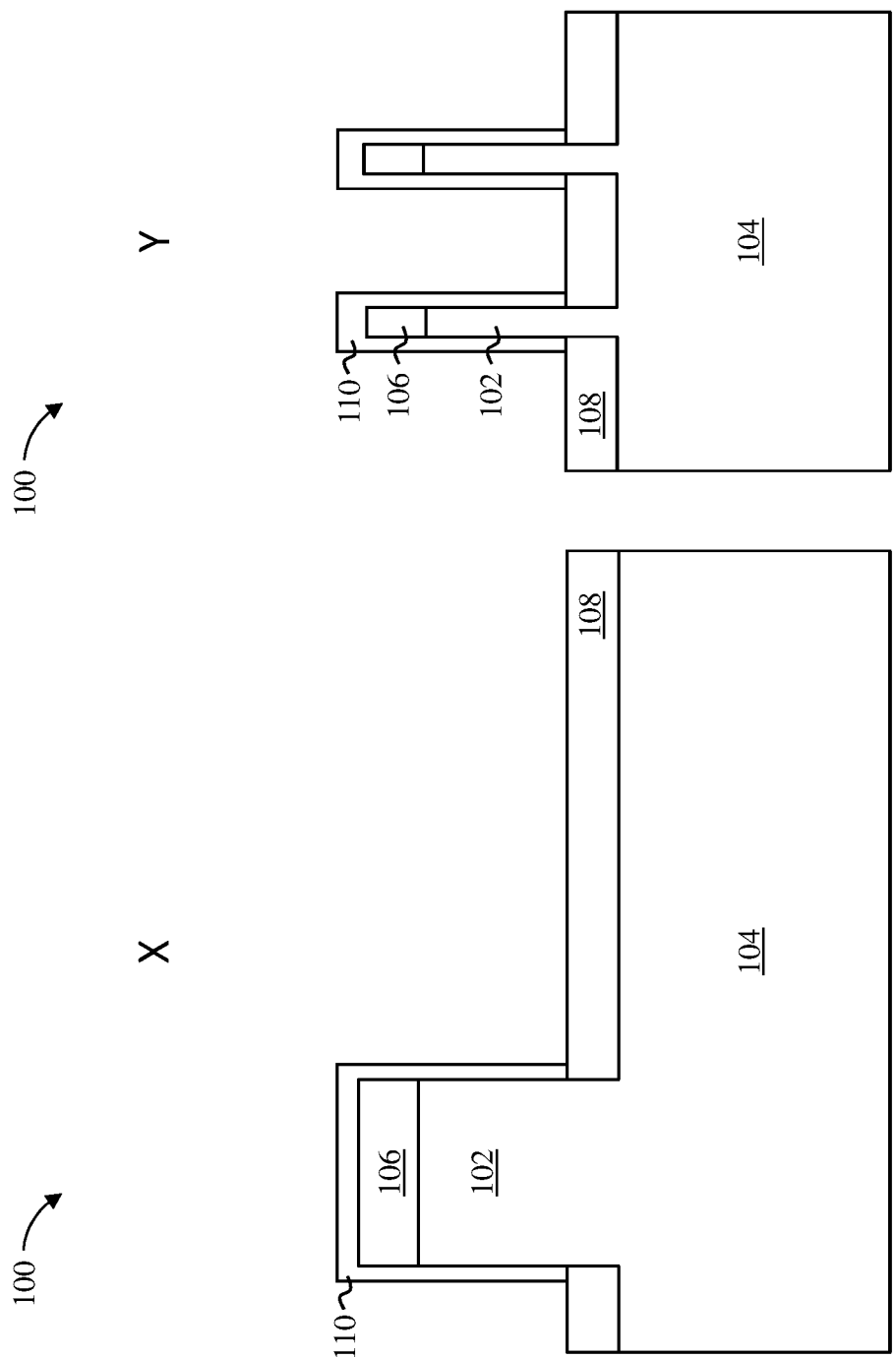

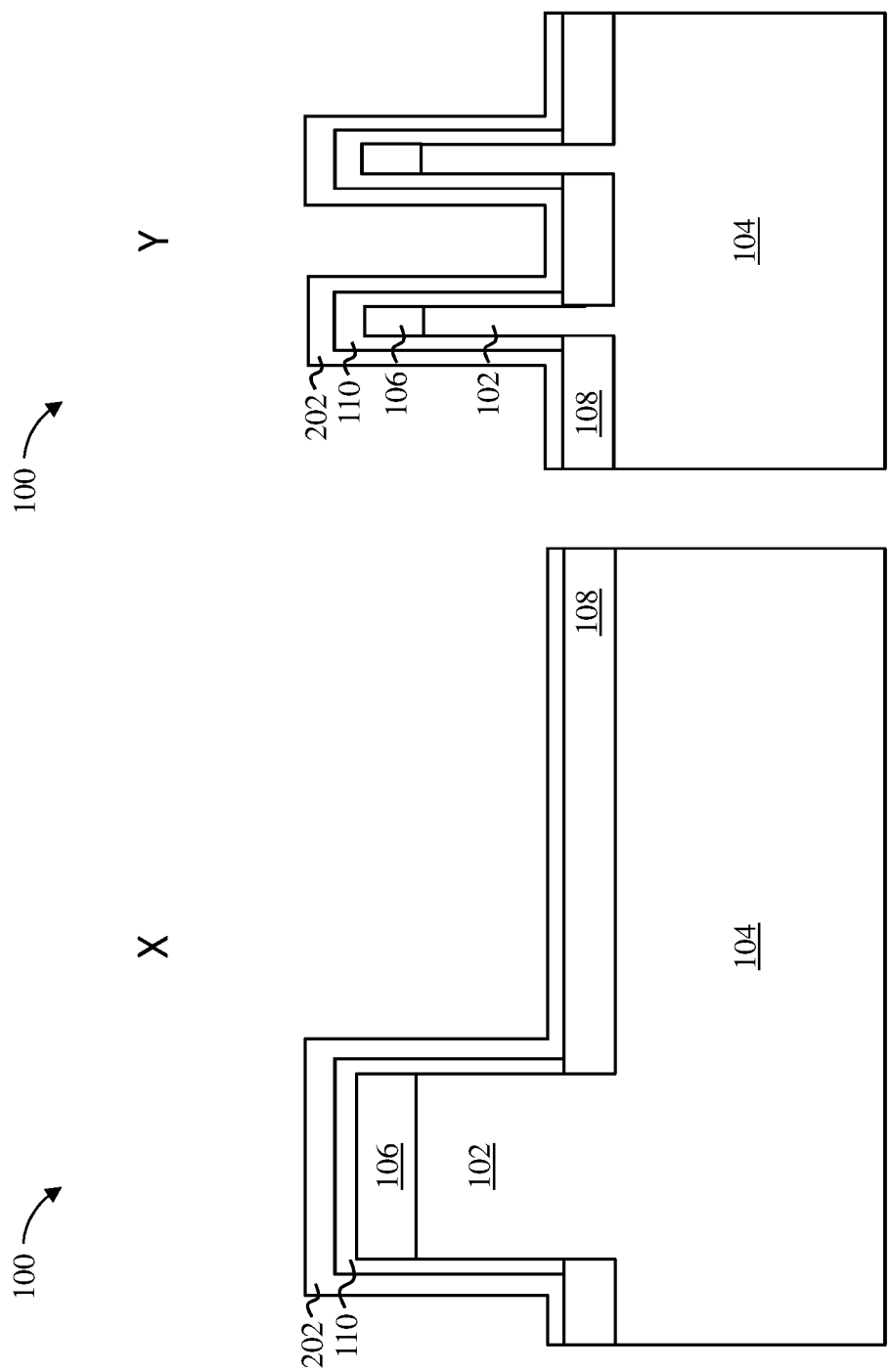

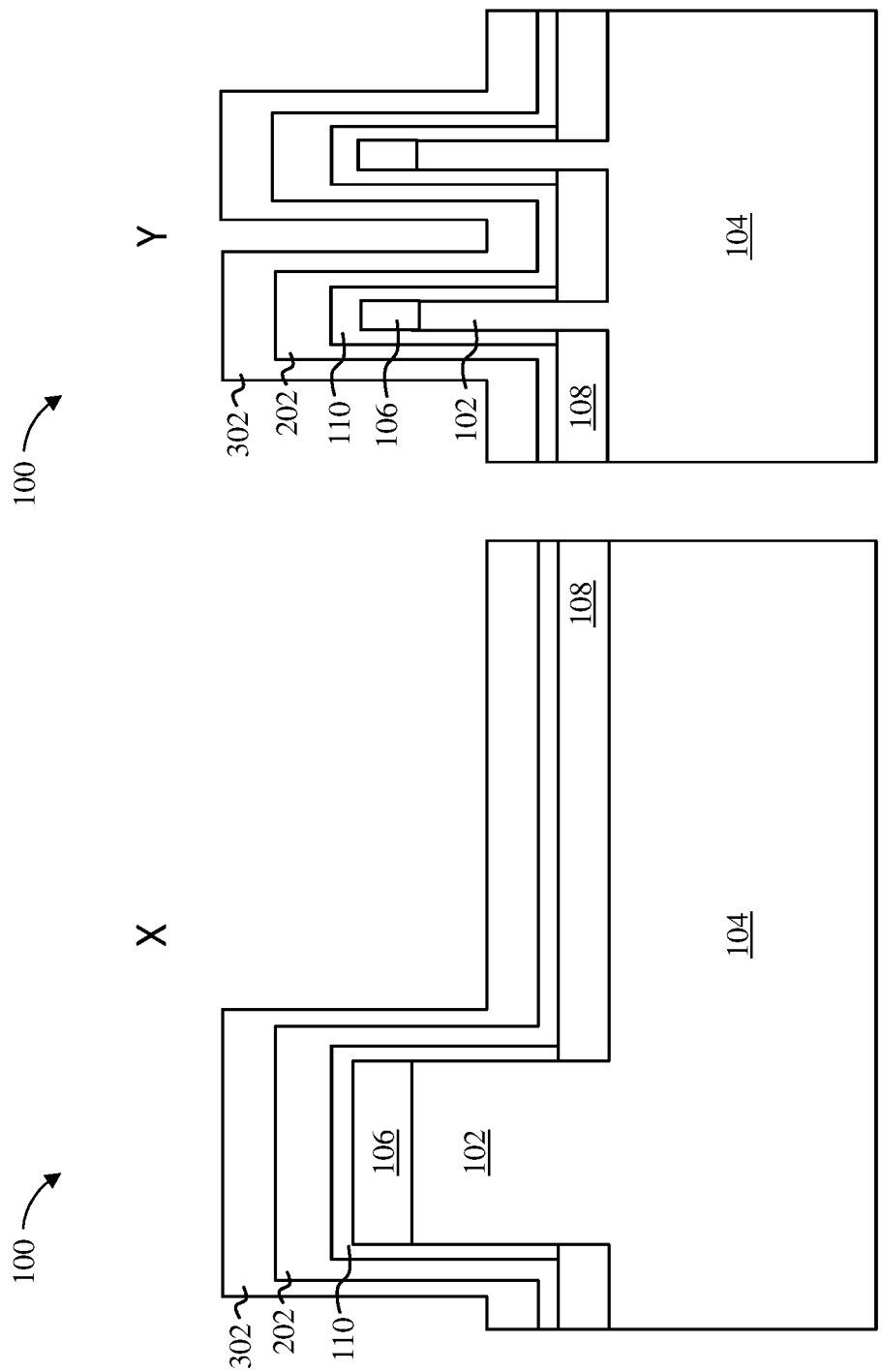

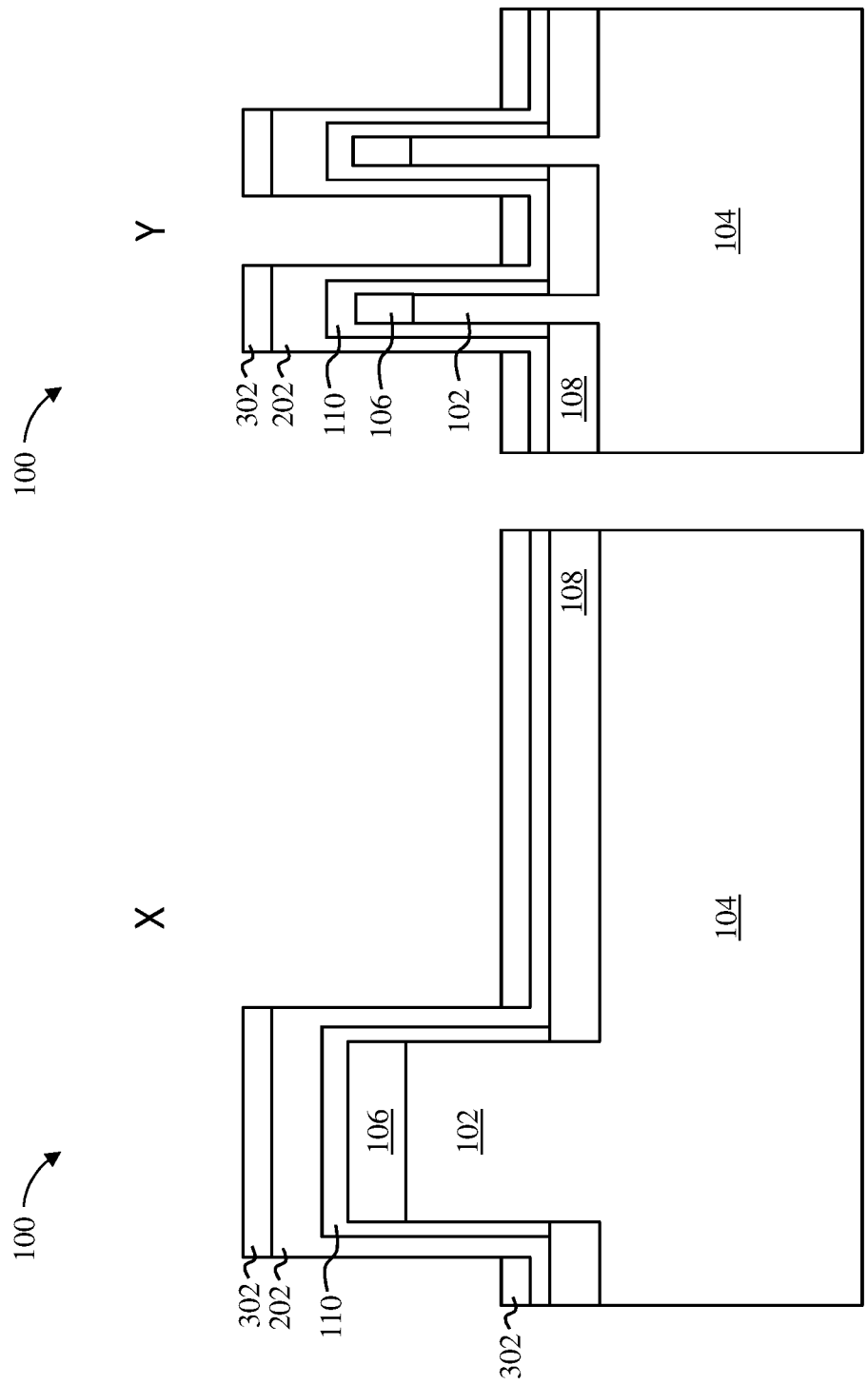

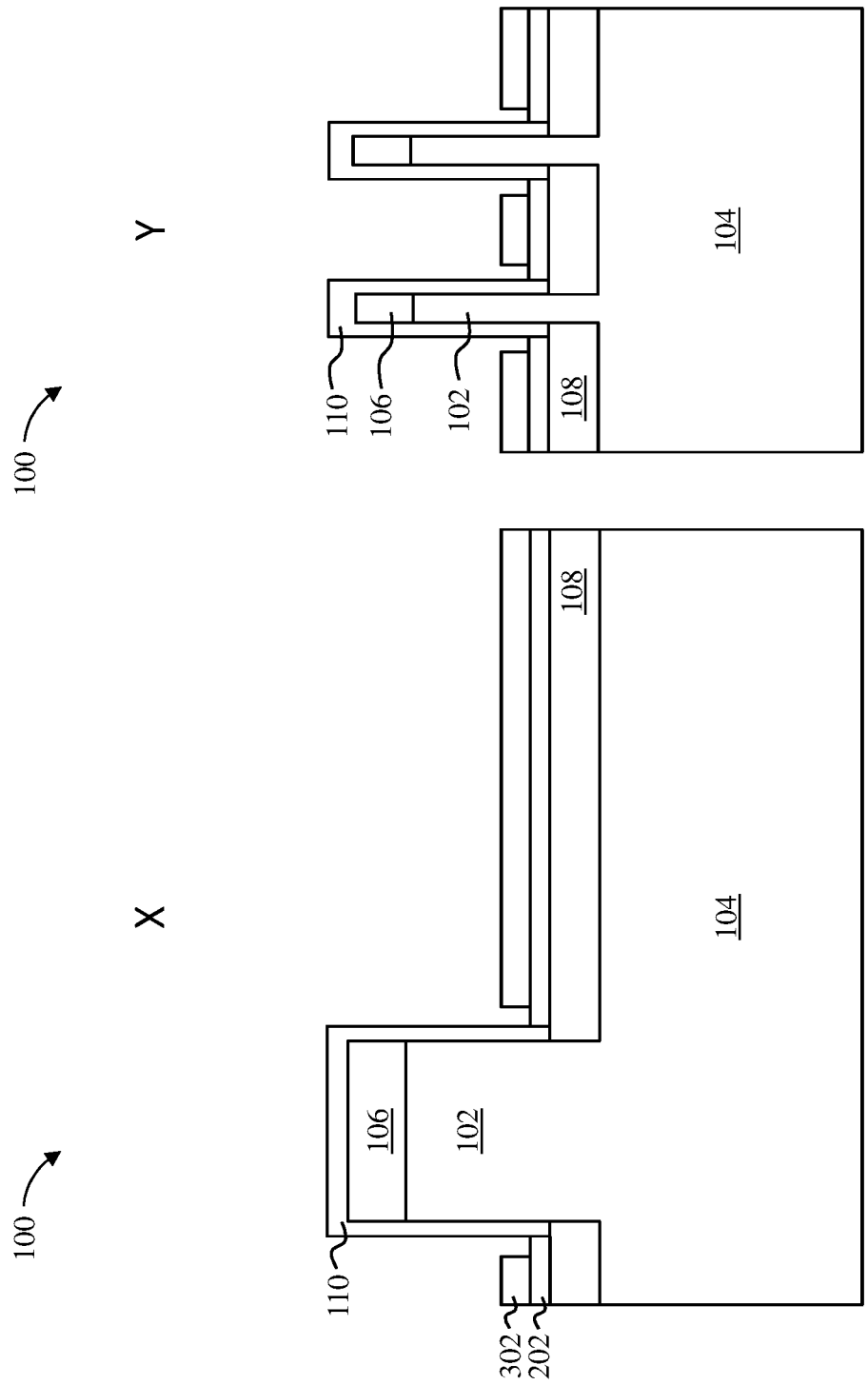

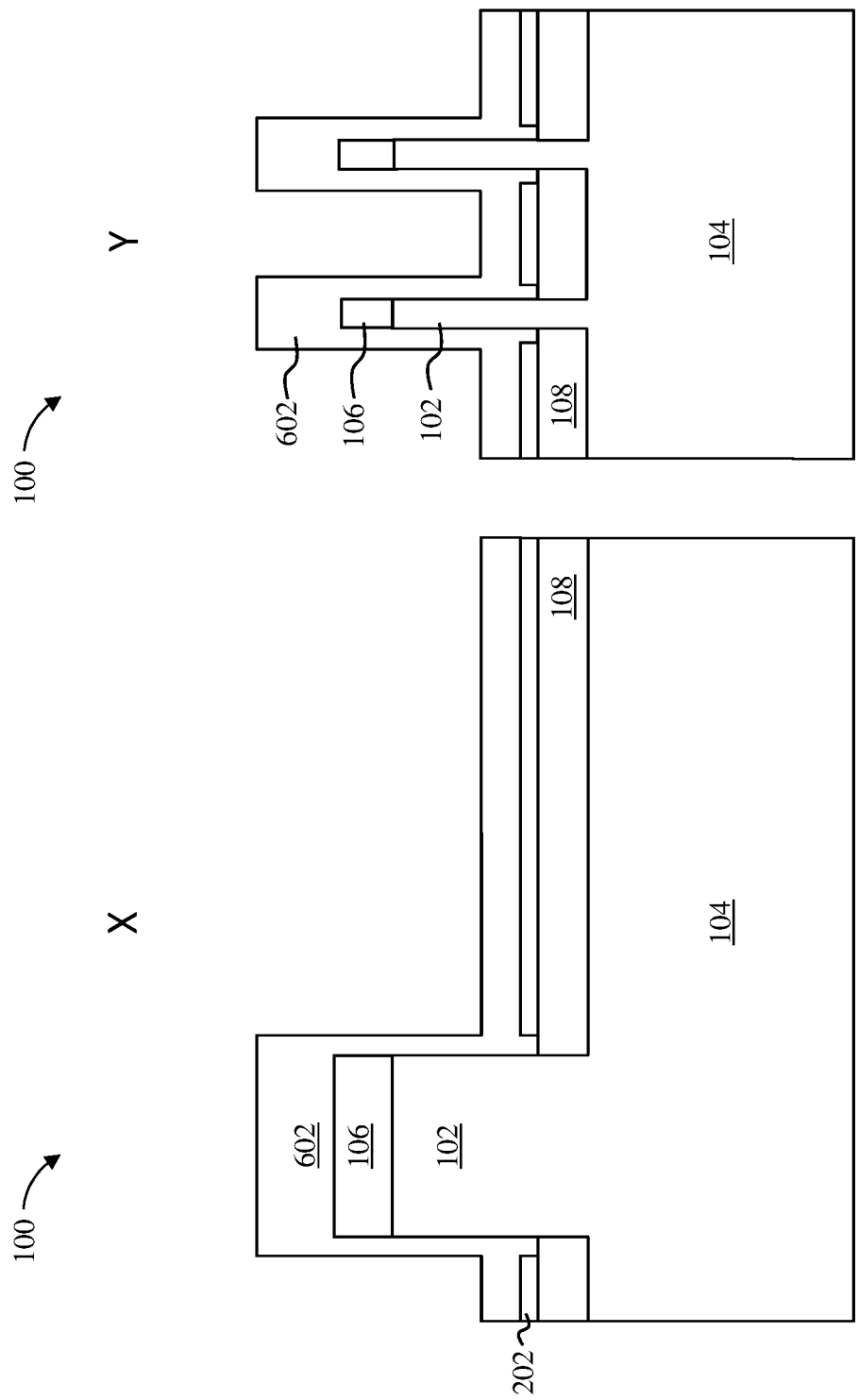

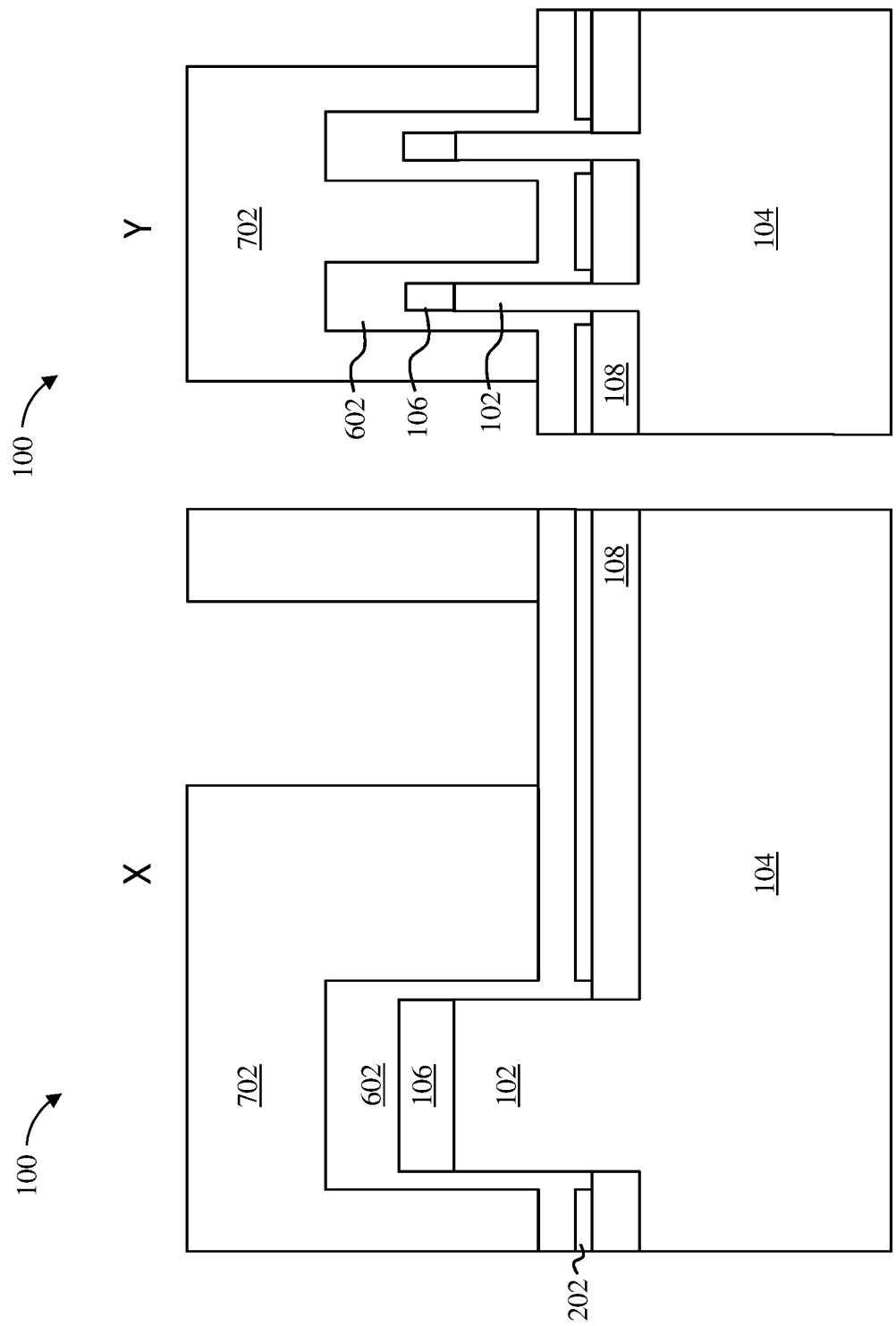

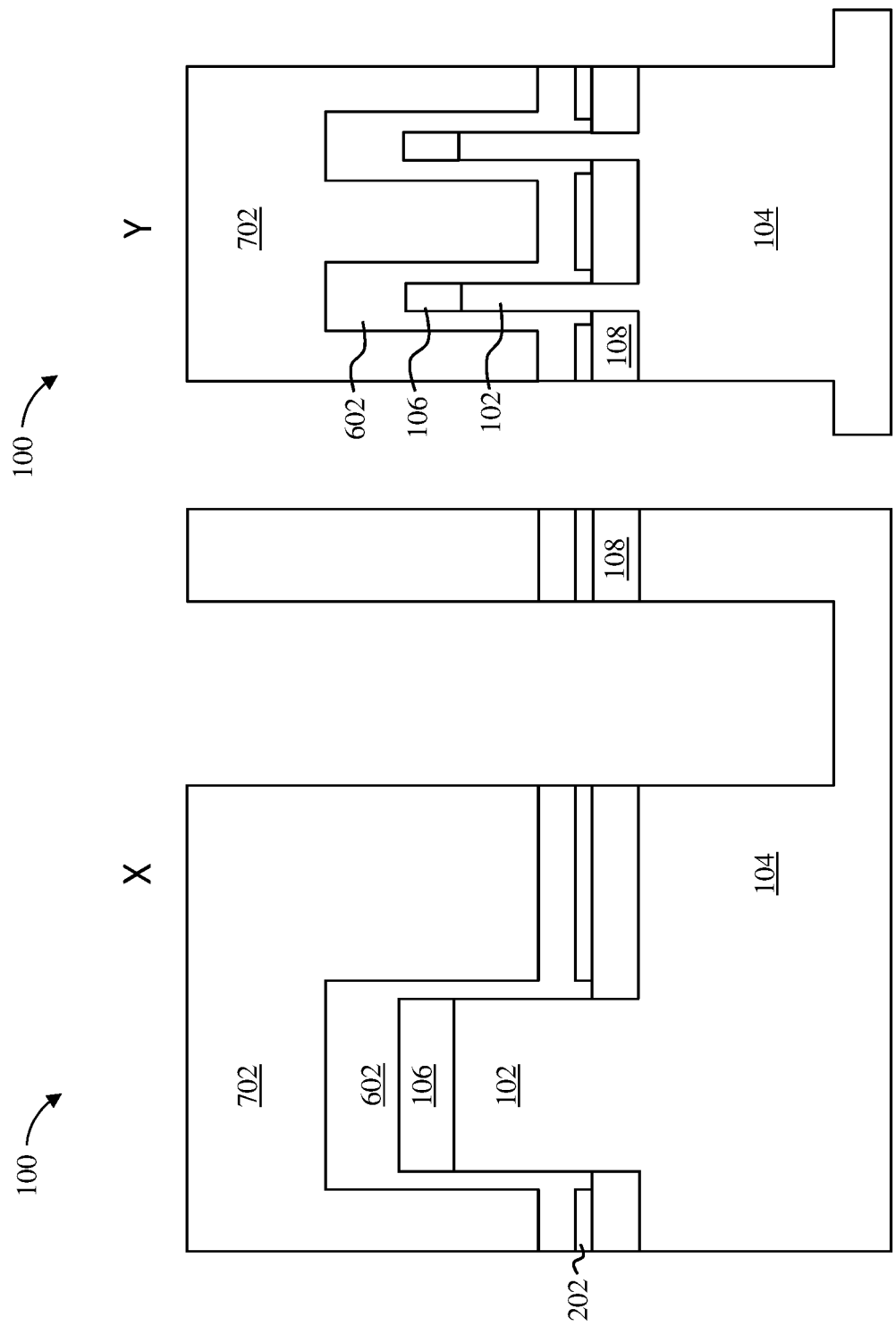

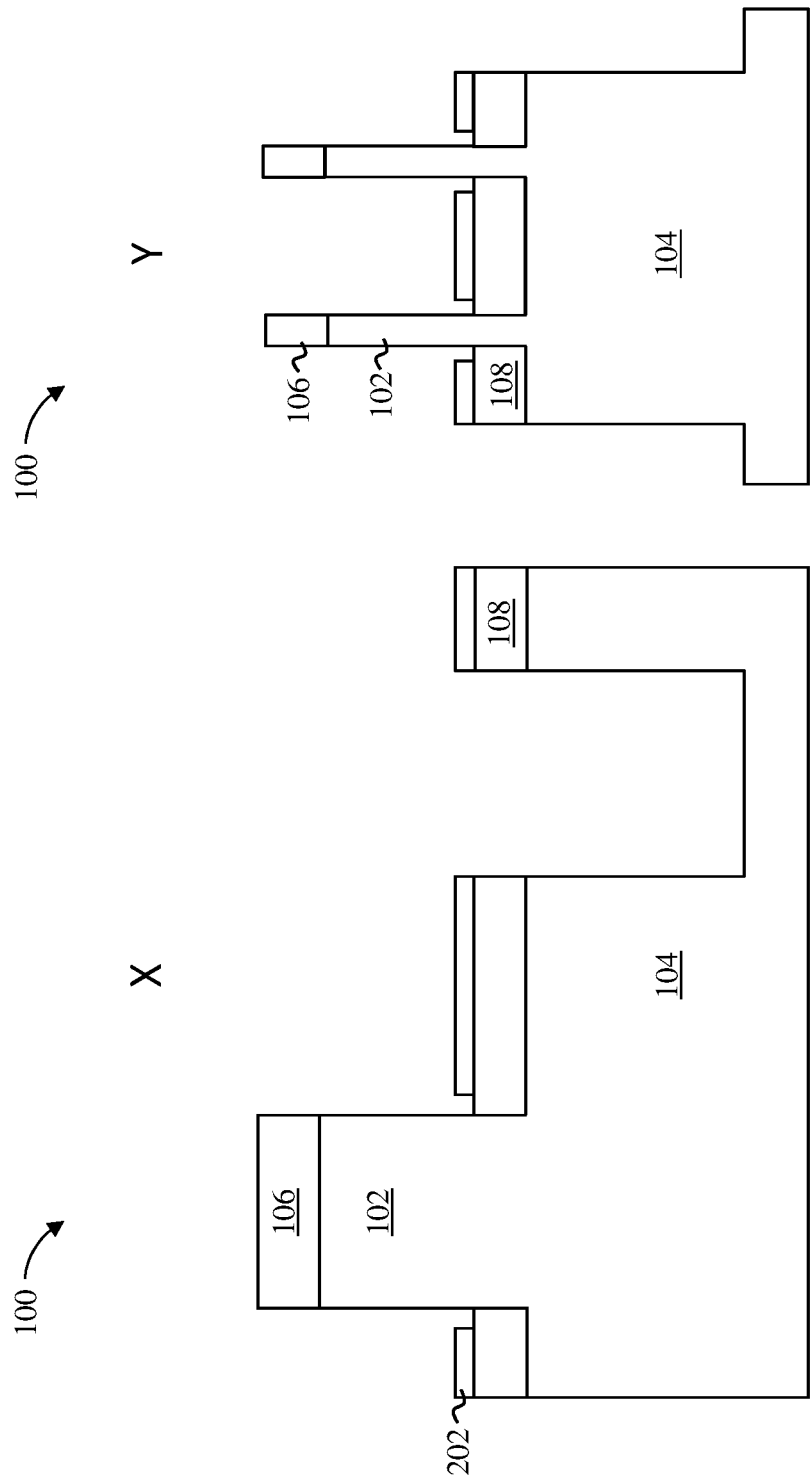

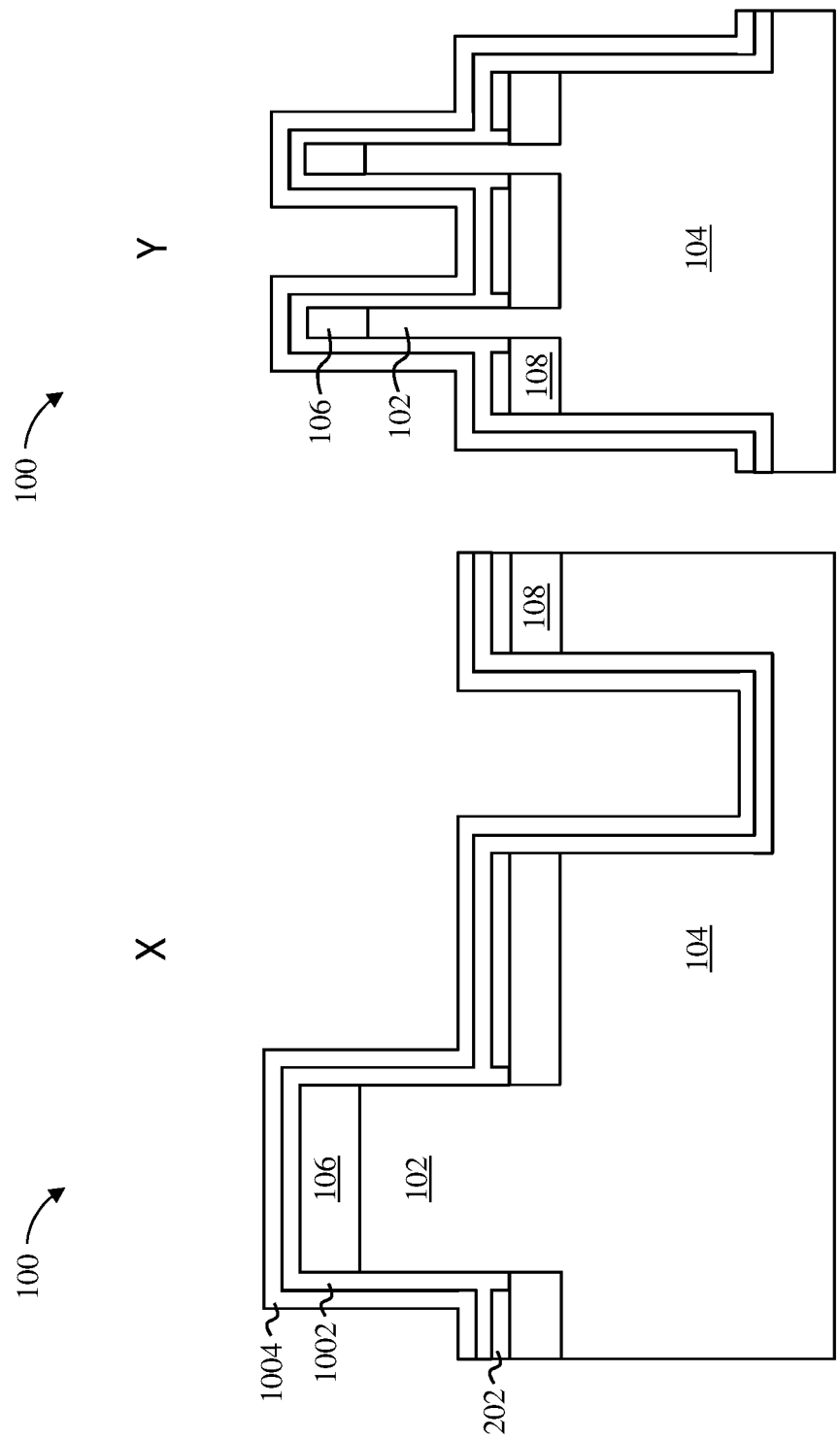

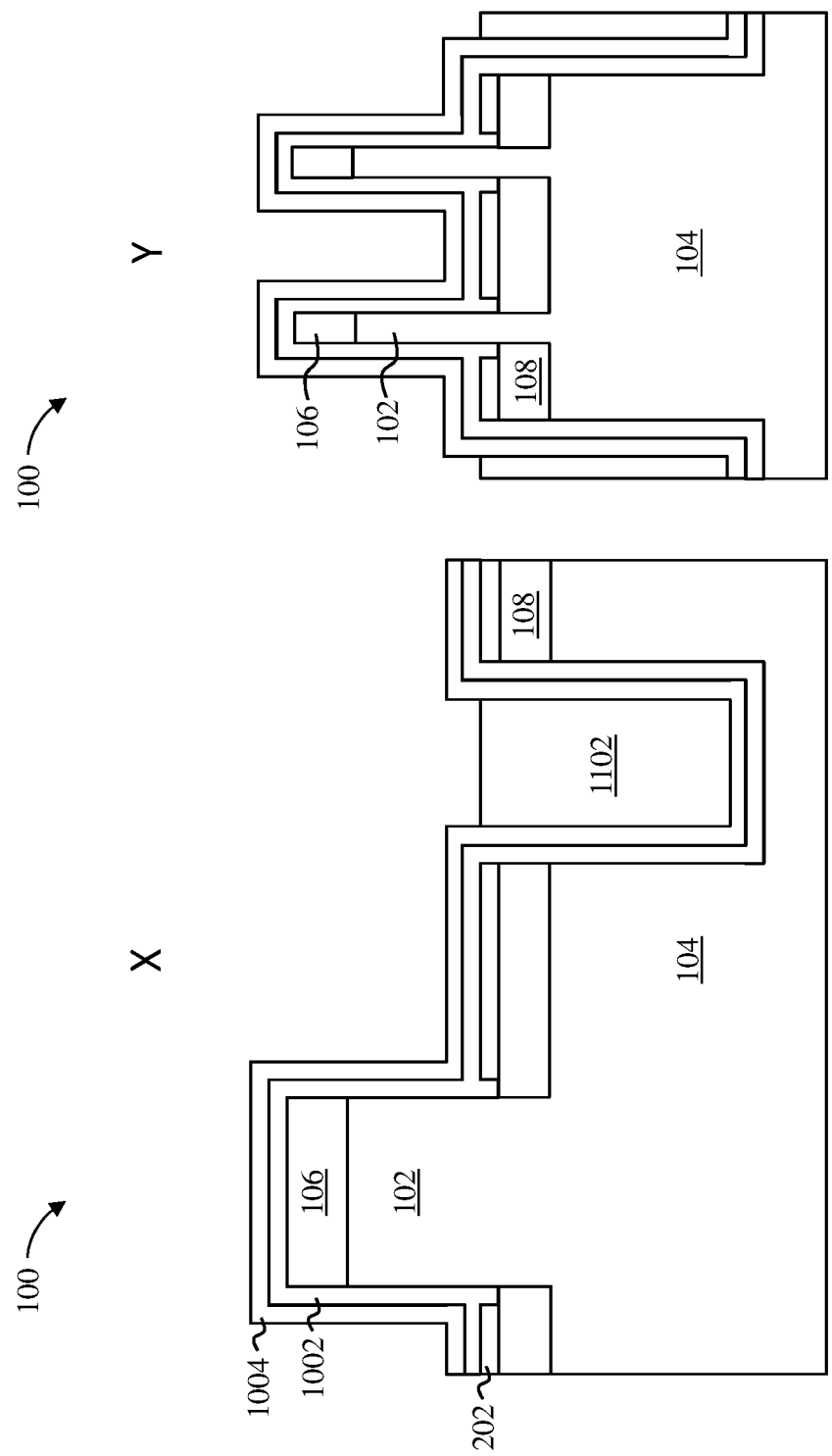

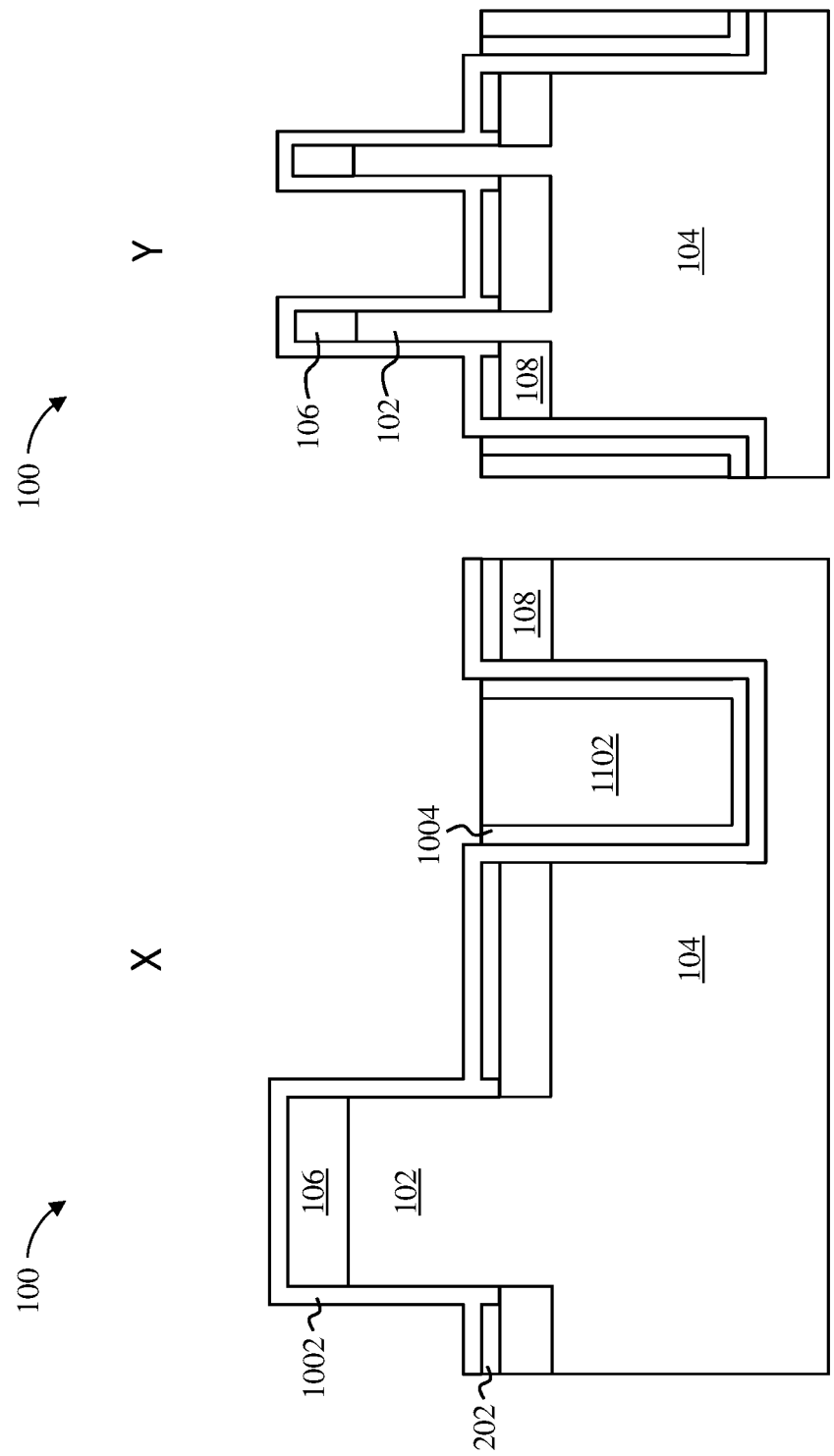

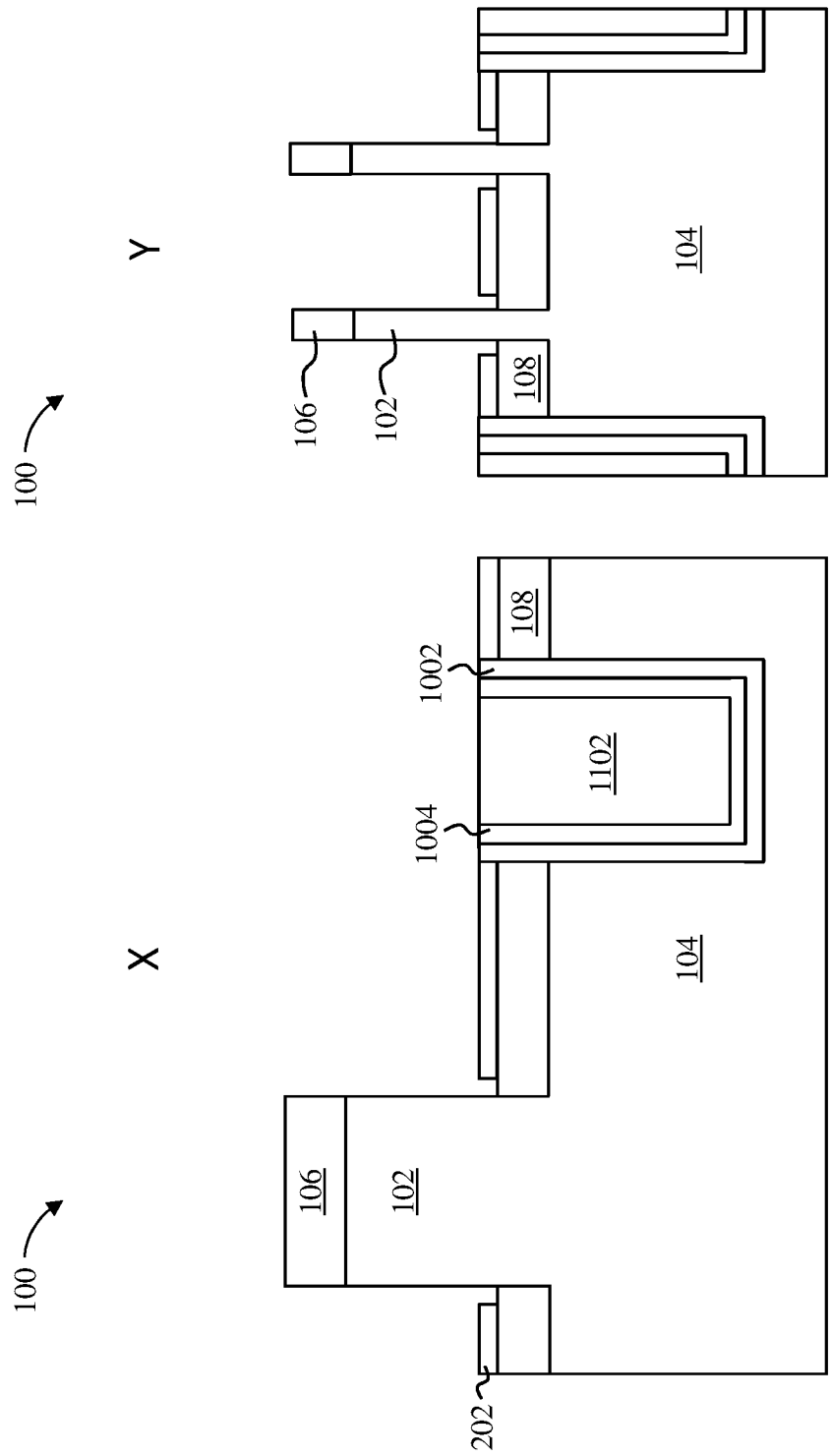

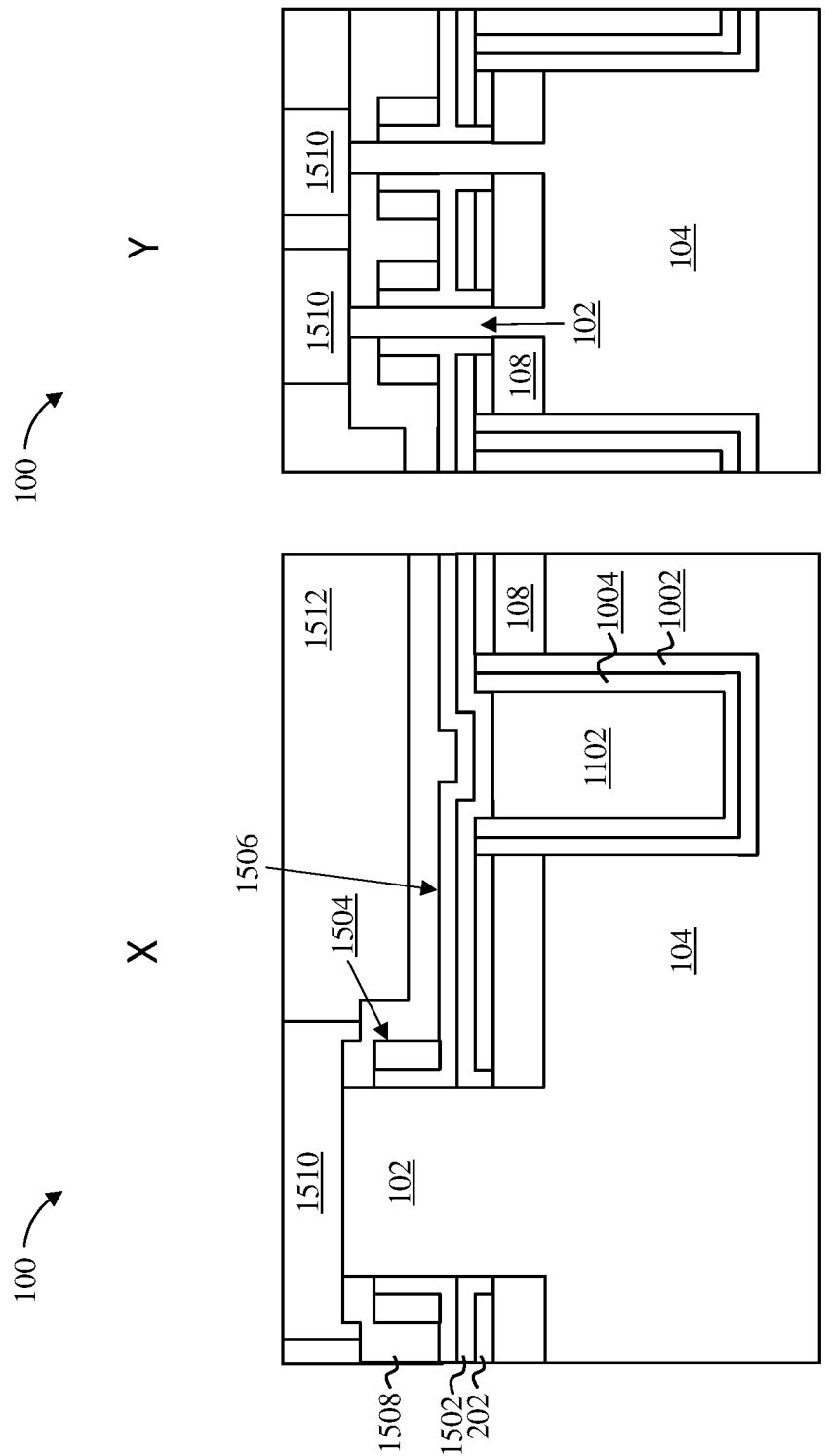

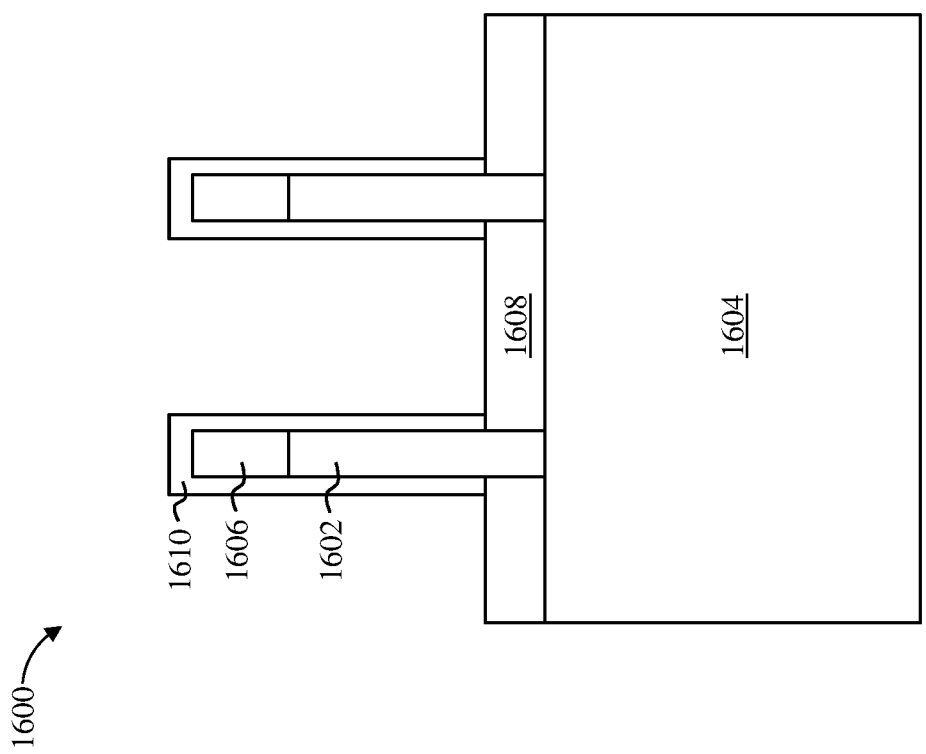

US 11,201,089 B2

1

ROBUST LOW-K BOTTOM SPACER FOR VFET

BACKGROUND

The present invention generally relates to fabrication methods and resulting structures for semiconductor devices, and more specifically, to fabrication methods and resulting structures that provide a robust low-k bottom spacer for a vertical field effect transistor (VFET).

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. Some nonplanar transistor device architectures, such as VFETs, employ semiconductor fins and side-gates that can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for forming a robust low-k bottom spacer for a VFET using a spacer first, shallow trench isolation last process integration. A non-limiting example of the method includes forming a semiconductor fin over a substrate. A first dielectric liner is formed on a sidewall of the semiconductor fin. The method can include forming a bottom spacer over the substrate and on a sidewall of the first dielectric liner. The first dielectric liner can be positioned between the semiconductor fin and the bottom spacer. Portions of the bottom spacer can be removed to define a shallow trench isolation region.

Embodiments of the invention are directed to a method for forming a robust low-k bottom spacer for a VFET using a spacer first, shallow trench isolation last process integration. A non-limiting example of the method includes forming a pair of semiconductor fins over a substrate. A bottom spacer is formed between the pair of semiconductor fins. The bottom spacer can be positioned adjacent to sidewalls of the pair of semiconductor fins. The method can include recessing a portion of the substrate between the pair of semiconductor fins. The substrate can be recessed below a bottommost surface of the bottom spacer. The method can include forming a shallow trench isolation region on a recessed surface of the substrate.

Embodiments of the invention are directed to a semiconductor device. A non-limiting example of the semiconductor device includes a semiconductor fin over a substrate. The device further includes a bottom spacer over the substrate and adjacent to a sidewall of the semiconductor fin. The bottom spacer can be formed by a bottom spacer first, shallow trench isolation last process. The process can include forming a first dielectric liner over a sidewall of the semiconductor fin and depositing spacer material over the substrate and on a sidewall of the first dielectric liner. The first dielectric liner can be positioned between the semiconductor fin and the spacer material. The process can further include forming a second dielectric liner on the spacer material such that a vertical thickness of the second dielectric liner is greater than a lateral thickness of the second dielectric liner. The process can further include removing portions of the second dielectric liner to expose a sidewall of the spacer material and removing exposed portions of the spacer material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a cross-sectional view of a semiconductor structure after initial processing operations according to one or more embodiments of the invention;

FIG. 1B depicts a cross-sectional view of the semiconductor structure after the initial processing operations according to one or more embodiments of the invention;

FIG. 2A depicts a cross-sectional view of the semiconductor structure after an intermediate operation of a method of fabricating a semiconductor device according to one or more embodiments of the invention;

FIG. 2B depicts a cross-sectional view of the semiconductor structure after an intermediate operation of a method of fabricating a semiconductor device according to one or more embodiments of the invention;

FIG. 3A depicts a cross-sectional view of the semiconductor structure after an intermediate operation of a method of fabricating a semiconductor device according to one or more embodiments of the invention;

FIG. 3B depicts a cross-sectional view of the semiconductor structure after an intermediate operation of a method of fabricating a semiconductor device according to one or more embodiments of the invention;

FIG. 4A depicts a cross-sectional view of the semiconductor structure after an intermediate operation of a method of fabricating a semiconductor device according to one or more embodiments of the invention;

FIG. 4B depicts a cross-sectional view of the semiconductor structure after an intermediate operation of a method of fabricating a semiconductor device according to one or more embodiments of the invention;

FIG. 5A depicts a cross-sectional view of the semiconductor structure after an intermediate operation of a method of fabricating a semiconductor device according to one or more embodiments of the invention;

FIG. 5B depicts a cross-sectional view of the semiconductor structure after an intermediate operation of a method of fabricating a semiconductor device according to one or more embodiments of the invention;

FIG. 6A depicts a cross-sectional view of the semiconductor structure after an intermediate operation of a method of fabricating a semiconductor device according to one or more embodiments of the invention;

FIG. 6B depicts a cross-sectional view of the semiconductor structure after an intermediate operation of a method of fabricating a semiconductor device according to one or more embodiments of the invention;

FIG. 7A depicts a cross-sectional view of the semiconductor structure after an intermediate operation of a method of fabricating a semiconductor device according to one or more embodiments of the invention;

FIG. 7B depicts a cross-sectional view of the semiconductor structure after an intermediate operation of a method of fabricating a semiconductor device according to one or more embodiments of the invention;

FIG. 8A depicts a cross-sectional view of the semiconductor structure after an intermediate operation of a method of fabricating a semiconductor device according to one or more embodiments of the invention;

FIG. 8B depicts a cross-sectional view of the semiconductor structure after an intermediate operation of a method of fabricating a semiconductor device according to one or more embodiments of the invention;

FIG. 9A depicts a cross-sectional view of the semiconductor structure after an intermediate operation of a method of fabricating a semiconductor device according to one or more embodiments of the invention;

FIG. 9B depicts a cross-sectional view of the semiconductor structure after an intermediate operation of a method of fabricating a semiconductor device according to one or more embodiments of the invention;

FIG. 10A depicts a cross-sectional view of the semiconductor structure after an intermediate operation of a method of fabricating a semiconductor device according to one or more embodiments of the invention;

FIG. 10B depicts a cross-sectional view of the semiconductor structure after an intermediate operation of a method of fabricating a semiconductor device according to one or more embodiments of the invention;

FIG. 12A depicts a cross-sectional view of the semiconductor structure after an intermediate operation of a method of fabricating a semiconductor device according to one or more embodiments of the invention;

FIG. 12B depicts a cross-sectional view of the semiconductor structure after an intermediate operation of a method of fabricating a semiconductor device according to one or more embodiments of the invention;

FIG. 13A depicts a cross-sectional view of the semiconductor structure after an intermediate operation of a method of fabricating a semiconductor device according to one or more embodiments of the invention;

FIG. 13B depicts a cross-sectional view of the semiconductor structure after an intermediate operation of a method of fabricating a semiconductor device according to one or more embodiments of the invention;

FIG. 14A depicts a cross-sectional view of the semiconductor structure after an intermediate operation of a method of fabricating a semiconductor device according to one or more embodiments of the invention;

FIG. 14B depicts a cross-sectional view of the semiconductor structure after an intermediate operation of a method of fabricating a semiconductor device according to one or more embodiments of the invention;

FIG. 15A depicts a cross-sectional view of the semiconductor structure after an intermediate operation of a method of fabricating a semiconductor device according to one or more embodiments of the invention;

FIG. 15B depicts a cross-sectional view of the semiconductor structure after an intermediate operation of a method of fabricating a semiconductor device according to one or more embodiments of the invention;

FIG. 16 depicts a cross-sectional view of a semiconductor structure after initial processing operations according to one or more embodiments of the invention.

Figure 11B:
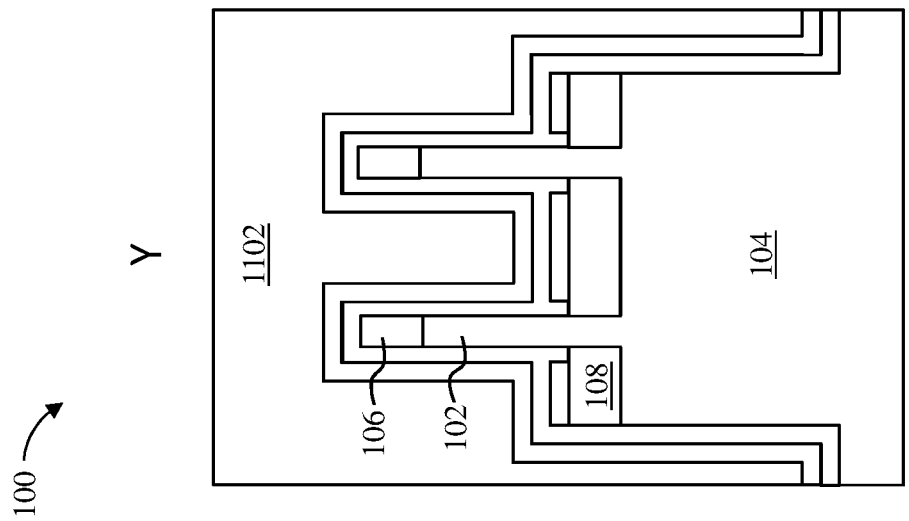
FIG. 11B depicts a cross-sectional view of the semiconductor structure after an intermediate operation of a method of fabricating a semiconductor device according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, a metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

To increase transistor densities, some device manufacturers have developed non-planar transistor architectures. In vertical field effect transistors (VFETs), for example, the source to drain current flows in a direction that is perpendicular to a major surface of the substrate. For example, in a known VFET configuration a major substrate surface is horizontal, and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

While VFET architectures have enabled smaller device footprints, there are challenges to providing VFETs with equal or superior performance characteristics to lateral devices. For example, the conventional VFET bottom spacer fabrication process includes a shallow trench isolation (STI) first, bottom spacer last process integration scheme. During this process, portions of the bottom spacer for the outermost fins (i.e., those fins nearest the lithographic process window) are wholly or partially lost or degraded, due to a required oxide liner etch. This is a critical failing, especially for a 2-fin device such as an SRAM, which ideally includes high quality low-k and high-k bottom spacers.

Turning now to an overview of aspects of the present invention, one or more embodiments of the invention address the above-described shortcomings of the prior art by providing fabrication methods and resulting structures that include a robust low-k bottom spacer for a VFET. As used herein, a "robust" bottom spacer refers to a bottom spacer that is not wholly or partially lost or degraded during a subsequent oxide liner etch. The process integration scheme described herein is a bottom spacer first, STI last work flow. Advantageously, a bottom spacer first approach allows for the integration of high quality, low-k bottom spacers that are not damaged or degraded at the outermost fins. Moreover, this reversed bottom spacer process scheme is compatible with a self-aligned process window integration flow.

Turning now to a more detailed description of aspects of the present invention, FIG. 1A depicts a cross-sectional view X (along fin) of a partially fabricated semiconductor structure 100 after an initial set of fabrication operations have been performed in accordance with embodiments of the invention. FIG. 1B depicts a cross-sectional view Y (across fin) of the semiconductor structure 100 shown in FIG. 1A after the initial set of fabrication operations have been performed in accordance with embodiments of the invention.

As depicted in FIG. 1A, the partially fabricated semiconductor structure 100 can include one or more semiconductor fins 102 formed on a substrate 104. The semiconductor fins 102 can be formed on the substrate 104 using known semiconductor fabrication techniques, including but not limited to, lithography followed by etching, sidewall image transfer (SIT), self-aligned double patterning (SADP), self-aligned multiple patterning (SAMP), and self-aligned quadruple patterning (SAQP). In some embodiments of the invention, a hard mask not shown) is patterned to expose portions of the substrate 104. The exposed portions of the substrate 104 can then be recessed to form a plurality of semiconductor fins. The exposed portions of the substrate 104 can be removed using an etch process, which can be a wet etch process, a dry etch process or a combination thereof. In some embodiments of the invention, the hard mask includes a nitride, such as silicon nitride. In some embodiments of the invention, the hard mask is formed to a thickness of 40 nm, although other thicknesses are within the contemplated scope of the invention.

The semiconductor fins 102 can each have a height ranging from 15 nm to 150 nm. In some embodiments of the present invention, the semiconductor fins 102 are formed to a height of about 20 nm. Each of the fins can have a width ranging from 5 nm to 50 nm. The fins can be separated by a pitch ranging from 10 nm to 100 nm. The semiconductor fins 102 can be doped with n-type dopants (e.g., As, P, Sb) or p-type dopants (e.g., B, Al, Ga), or can be intrinsically undoped (i.e., doping concentration less than $1 \times 10^{16}$ $cm^{-3}$) to form nFET semiconductor fins and pFET semiconductor fins, as desired. If the semiconductor fins 102 are doped, the dopant concentration can range from $1 \times 10^{16}$ $cm^{-3}$ to $2 \times 10^{21}$ $cm^{-3}$, or between $1 \times 10^{18}$ $cm^{-3}$ and $1 \times 10^{20}$ $cm^{-3}$. In some embodiments of the invention, the semiconductor fins 102 are epitaxially grown on the substrate 104.

The semiconductor fins 102 can be made of any suitable material, such as, for example, Si, SiGe, Group II-IV compound semiconductor, Group III-V compound semiconductor, or other suitable materials. Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The substrate 104 can be made of any suitable substrate material, such as, for example, Si, SiGe, SiC, Group III-V compound semiconductor, Group II-VI compound semiconductor, or semiconductor-on-insulator (SOI). For example, in embodiments where the semiconductor fins 102 are made of InGaAs, the substrate 104 can be made of InP. In some embodiments of the invention, the substrate 104 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. In some embodiments of the invention, the semiconductor structure 100 can be electrically isolated from other regions of the substrate 104 by a shallow trench isolation region (not depicted).

As further depicted in FIG. 1A, the semiconductor structure 100 can include a bottom source/drain 108. In some embodiments of the invention, the bottom source/drain 108 is formed by doping a top portion of the substrate 104. In some embodiments of the invention, the bottom source/drain 108 is epitaxially grown on the substrate 104. Epitaxial semiconductor materials can be grown using, for example, vapor-phase epitaxy (VPE), molecular beam epitaxy (MBE), liquid-phase epitaxy (LPE), or other suitable processes. The bottom source/drain 108 can include epitaxial semiconductor materials grown from gaseous or liquid precursors.

In some embodiments of the invention, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxial silicon and silicon germanium can be doped by adding n-type dopants (e.g., phosphorus or arsenic) or p-type dopants (e.g., Ga, B, BF$_2$, or Al). In some embodiments of the invention, the bottom source/drain 108 can be epitaxially formed and doped by a variety of methods, such as, for example, in-situ doped epitaxy (doped during deposition), and/or doped following the epitaxy, for example, by ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

As further depicted in FIG. 1A, a dielectric liner 110 can be formed over the semiconductor fins 102. In some embodiments of the invention, the dielectric liner 110 is formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, or other like process.

In some embodiments of the invention, dielectric material can be conformally deposited over the semiconductor structure 100 using, for example, CVD or ALD, and then patterned using, for example, a directional reactive ion etch (RIE). The dielectric liner 110 can be made of any suitable material, such as, for example, a dielectric, a nitride, silicon nitride, silicon oxide, SiON, SiC, SiOCN, or SiBCN. In some embodiments of the invention, the dielectric liner 110 is made of SiO$_2$. The dielectric liner 110 can be formed to a thickness of about 1 to 10 nm, for example 2 nm, although other thicknesses are within the contemplated scope of the invention.

FIGS. 2A and 2B depict cross-sectional views X and Y, respectively, of the partially fabricated semiconductor structure 100 after an intermediate operation of a method of fabricating a semiconductor device according to one or more embodiments of the invention. As depicted in FIG. 2A, a bottom spacer 202 can be formed over the dielectric liner 110.

In some embodiments of the invention, the bottom spacer 202 is formed using a CVD, PECVD, ALD, PVD, chemical solution deposition, or other like processes. For example, spacer material can be directionally deposited over the semiconductor structure 100. In some embodiments of the invention, the bottom spacer 202 is conformally formed using CVD or ALD. The bottom spacer 202 can be made of any suitable material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The bottom spacer 202 can be formed to a thickness of about 5 to 10 nm, although other thicknesses are within the contemplated scope of the invention.

FIGS. 3A and 3B depict cross-sectional views X and Y, respectively, of the partially fabricated semiconductor structure 100 after an intermediate operation of a method of fabricating a semiconductor device according to one or more embodiments of the invention. As depicted in FIG. 3B, a dielectric liner 302 can be formed over the bottom spacer 202.

In some embodiments of the invention, the dielectric liner 302 is formed using a CVD, PECVD, UHVCVD, RTCVD, MOCVD, LPCVD, LRPCVD, ALD, PVD, high density plasma (HDP) CVD, chemical solution deposition, or other like process. In some embodiments of the invention, dielectric material can be conformally deposited over the semiconductor structure 100 using, for example, CVD or ALD. The dielectric liner 302 can be made of any suitable material, such as, for example, a low-k dielectric, a nitride, silicon nitride, silicon oxide, SiON, SiC, SiOCN, or SiBCN. In some embodiments of the invention, the dielectric liner 302 is made of $SiO_2$. The dielectric liner 302 can be formed to a thickness of about 1 to 10 nm, for example 2 nm, although other thicknesses are within the contemplated scope of the invention.

In some embodiments of the invention, the dielectric liner 302 is formed using a directional deposition process, such as a HDP oxide deposition, during which more dielectric material is deposited on the horizontal surfaces of the semiconductor structure 100. In other words, the lateral thickness of the deposited dielectric material can be less than the vertical thickness of the deposited dielectric material.

FIGS. 4A and 4B depict cross-sectional views X and Y, respectively, of the partially fabricated semiconductor structure 100 after an intermediate operation of a method of fabricating a semiconductor device according to one or more embodiments of the invention. As depicted in FIG. 4A, portions of the dielectric liner 302 can be removed to expose sidewalls of the bottom spacer 202. The dielectric liner 302 can be partially removed using a wet etch, a dry etch, or a combination of sequential wet and/or dry etches. In some embodiments of the invention, portions of the dielectric liner 302 are removed using an isotropic etch process, for example, a buffered hydrofluoric (BHF) acid etch.

FIGS. 5A and 5B depict cross-sectional views X and Y, respectively, of the partially fabricated semiconductor structure 100 after an intermediate operation of a method of fabricating a semiconductor device according to one or more embodiments of the invention. As depicted in FIG. 5A, exposed portions of the bottom spacer 202 can be removed. The bottom spacer 202 can be partially removed using a wet etch, a dry etch, or a combination of sequential wet and/or dry etches. In some embodiments of the invention, the bottom spacer 202 is removed selective to the dielectric liner 110 and/or the dielectric liner 302. For example, SiBCN and SiN can be etched selective to $SiO_2$ using a hot phosphoric acid ($H_3PO_4$) etch.

FIGS. 6A and 6B depict cross-sectional views X and Y, respectively, of the partially fabricated semiconductor structure 100 after an intermediate operation of a method of fabricating a semiconductor device according to one or more embodiments of the invention. As depicted in FIG. 6A, additional dielectric material can be deposited over the semiconductor structure 100. In some embodiments of the invention, the dielectric liner 110 and the dielectric liner 302 are a same material, and merge into a single dielectric liner 602. Advantageously, forming the dielectric liner 602 in the manner ensures that the dielectric liner 602 is between the bottom spacer 202 and the semiconductor fins 102.

FIGS. 7A and 7B depict cross-sectional views X and Y, respectively, of the partially fabricated semiconductor structure 100 after an intermediate operation of a method of fabricating a semiconductor device according to one or more embodiments of the invention. As depicted in FIG. 7A, a mask 702 can be formed over the semiconductor structure 100. The mask 702 can be formed using any suitable material, such as, for example, an organic planarization layer (OPL). In some embodiments of the invention, the mask 702 is patterned to expose a surface of the dielectric liner 602.

FIGS. 8A and 8B depict cross-sectional views X and Y, respectively, of the partially fabricated semiconductor structure 100 after an intermediate operation of a method of fabricating a semiconductor device according to one or more embodiments of the invention. As depicted in FIG. 8A, exposed portions of the dielectric liner 602, bottom spacer 202, and bottom source/drain 108 (i.e., those portions not covered by the mask 702) can be removed. The dielectric liner 602, bottom spacer 202, and bottom source/drain 108 can be removed using, for example, a wet etch, a dry etch, or a combination of sequential wet and/or dry etches. In some embodiments of the invention, the exposed portions of the dielectric liner 602, bottom spacer 202, and bottom source/drain 108 can be removed using a reactive ion (RIE) process to expose a surface of the substrate 104. In some embodiments of the invention, the exposed surface of the substrate 104 is recessed to define a shallow trench isolation (STI) region.

FIGS. 9A and 9B depict cross-sectional views X and Y, respectively, of the partially fabricated semiconductor structure 100 after an intermediate operation of a method of fabricating a semiconductor device according to one or more embodiments of the invention. As depicted in FIG. 9A, the mask 702 can be removed, using, for example, OPL can be removed by using oxygen plasma ashing process. Once exposed, the dielectric liner 602 can be removed using a wet or dry etch. In some embodiments of the invention, the dielectric liner 602 is an oxide liner and is removed using a buffered hydrofluoric acid etch.

FIGS. 10A and 10B depict cross-sectional views X and Y, respectively, of the partially fabricated semiconductor structure 100 after an intermediate operation of a method of fabricating a semiconductor device according to one or more embodiments of the invention. As depicted in FIG. 10A, a liner 1002 and a liner 1004 can be formed over the semiconductor structure 100. In some embodiments of the invention, the liner 1002 and the liner 1004 define a two-layer dielectric liner. In some embodiments of the invention, the liner 1002 is an oxide liner (e.g., $SiO_2$) and the liner 1004 is a nitride liner (e.g., SiN).

In some embodiments of the invention, the liner 1002 and the liner 1004 are each formed using a CVD, PECVD, UHVCVD, RTCVD, MOCVD, LPCVD, LRPCVD, ALD, PVD, chemical solution deposition, or other like process. In some embodiments of the invention, dielectric material can be conformally deposited over the semiconductor structure 100 using, for example, CVD or ALD. In some embodiments of the invention, the liner 1002 is formed to a thickness of about 1 to 5 nm, for example 3 nm, although other thicknesses are within the contemplated scope of the invention. In some embodiments of the invention, the liner 1004 is formed to a thickness of about 1 to 15 nm, for example 6 nm, although other thicknesses are within the contemplated scope of the invention.

Figure 11A:
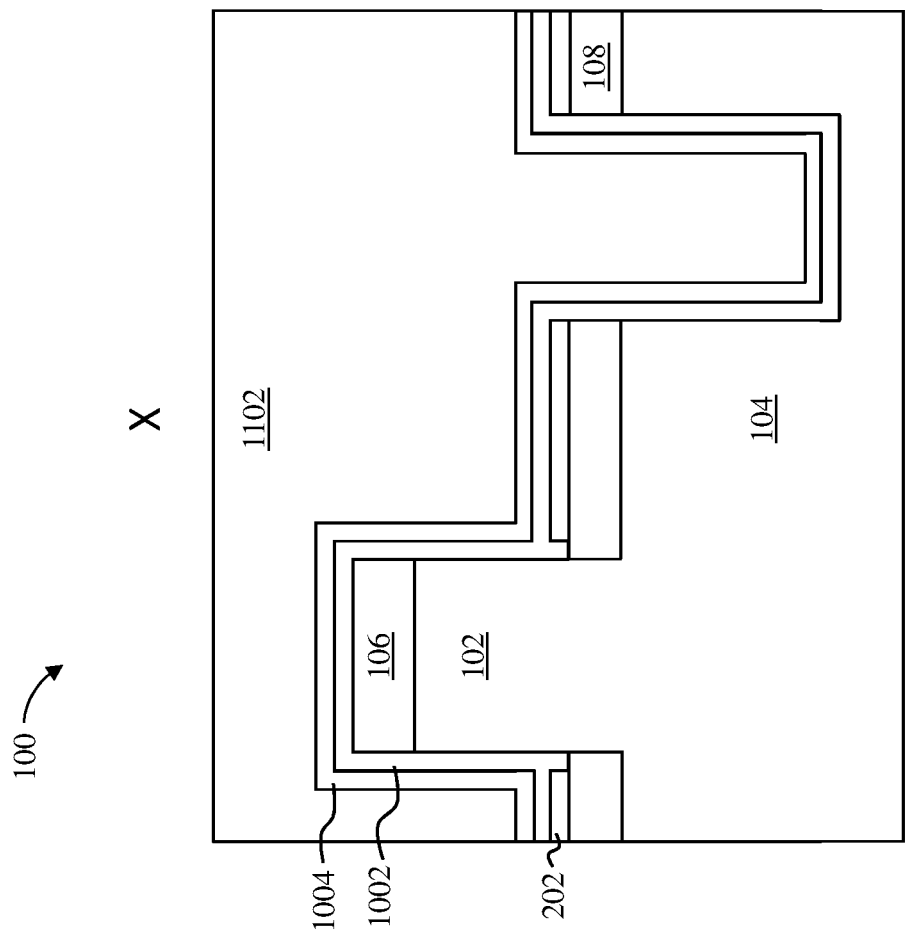
FIG. 11A depicts a cross-sectional view of the semiconductor structure after an intermediate operation of a method of fabricating a semiconductor device according to one or more embodiments of the invention.

FIGS. 11A and 11B depict cross-sectional views X and Y, respectively, of the partially fabricated semiconductor structure 100 after an intermediate operation of a method of fabricating a semiconductor device according to one or more embodiments of the invention. As depicted in FIG. 11A, a STI region 1102 is formed over the liner 1004. The STI region 1102 can be formed using any suitable isolation material, such as, for example, silicon nitride, silicon oxide, or SiOCN. In some embodiments of the invention, the STI region 1102 is formed using a flowable oxide deposition/densification process followed by a planarization process such as a chemical mechanical polish (CMP).

FIGS. 12A and 12B depict cross-sectional views X and Y, respectively, of the partially fabricated semiconductor structure 100 after an intermediate operation of a method of fabricating a semiconductor device according to one or more embodiments of the invention. As depicted in FIG. 12A, the STI region 1102 can be recessed below a surface of the liner 1004. In some embodiments of the invention, the STI region 1102 is further recessed below a surface of the liner 1002 and the bottom spacer 202.

FIGS. 13A and 13B depict cross-sectional views X and Y, respectively, of the partially fabricated semiconductor structure 100 after an intermediate operation of a method of fabricating a semiconductor device according to one or more embodiments of the invention. As depicted in FIG. 13A, portions of the liner 1004 can be removed. The liner 1004 can be partially removed using a wet etch, a dry etch, or a combination of sequential wet and/or dry etches. In some embodiments of the invention, the liner 1004 is removed selective to the liner 1002 and/or the STI region 1102. For example, SiBCN and SiN can be etched selective to SiO₂ using a hot phosphoric acid etch.

FIGS. 14A and 14B depict cross-sectional views X and Y, respectively, of the partially fabricated semiconductor structure 100 after an intermediate operation of a method of fabricating a semiconductor device according to one or more embodiments of the invention. As depicted in FIG. 14A, once exposed, the liner 1002 can be removed using a wet or dry etch. In some embodiments of the invention, the liner 1002 is an oxide liner (e.g., SiO₂) and is removed using a buffered hydrofluoric acid etch.

FIGS. 15A and 15B depict cross-sectional views X and Y, respectively, of the partially fabricated semiconductor structure 100 after an intermediate operation of a method of fabricating a semiconductor device according to one or more embodiments of the invention.

As depicted in FIG. 15A, optionally, a liner 1502 can be formed over the bottom spacer 202. In some embodiments of the invention, the liner 1502 is an oxide liner (e.g., SiO₂) formed using, for example, CVD, PECVD, UHVCVD, RTCVD, MOCVD, LPCVD, LRPCVD, ALD, PVD, chemical solution deposition, or other like process. In some embodiments of the invention, dielectric material can be conformally deposited over the semiconductor structure 100 using, for example, CVD or ALD. In some embodiments of the invention, the liner 1502 is formed to a thickness of about 1 to 5 nm, for example 3 nm, although other thicknesses are within the contemplated scope of the invention. In some embodiments, the liner 1502 is omitted.

As further depicted in FIG. 15A, the semiconductor device 100 can include a gate 1504 (sometimes referred to as a high-k metal gate), a gate dielectric 1506, a top spacer 1508, a top source/drain 1510, and an interlayer dielectric 1512.

The gate 1504 can be a high-k metal gate (HKMG) formed using, for example, known replacement metal gate (RMG) processes, or so-called gate-first processes. The gate 1504 can include a high-k dielectric material(s) (e.g., the gate dielectric 1506) and a work function metal stack. In some embodiments, the gate 1504 further comprises bulk conductive gate material(s).

In some embodiments of the invention, the gate dielectric 1506 is a high-k dielectric film formed on a surface (sidewall) of the semiconductor fins 202. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gate 1504 includes one or more work function layers (sometimes referred to as a work function metal stack) formed between the high-k dielectric film and a bulk gate material. In some embodiments of the invention, the gate 1504 includes one or more work function layers, but does not include a bulk gate material.

The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gate 1504 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments of the invention, a bulk gate conductive material is deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

The top spacer 1508 can be formed using a CVD, PECVD, ALD, PVD, chemical solution deposition, or other like processes. For example, spacer material can be directionally deposited over the semiconductor structure 100. In some embodiments of the invention, the top spacer 1508 is conformally formed using CVD or ALD. The top spacer 1508 can be made of any suitable material, such as, for example, a low-k dielectric, a nitride, silicon nitride, silicon oxide, SiON, SiC, SiOCN, or SiBCN. The top spacer 1508 can be formed to a thickness of about 5 to 10 nm, although other thicknesses are within the contemplated scope of the invention.

The semiconductor structure 100 can include a top source/drain 1510 formed on a surface of the semiconductor fins 102. In some embodiments of the invention, the top source/drain 1510 is epitaxially grown in a similar manner as the bottom source/drain 108. The top source/drain 1510 can include, for example, epitaxial semiconductor materials grown from gaseous or liquid precursors. The top source/drain 1510 can be can be doped in a similar manner as the bottom source/drain 108. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

FIG. 16 depicts a cross-sectional view of a partially fabricated semiconductor structure 1600 after an initial operation of a method of fabricating a semiconductor device according to one or more embodiments of the invention. As depicted in FIG. 16, the partially fabricated semiconductor structure 1600 can include one or more semiconductor fins 1602 formed on a substrate 1604. The semiconductor fins 1602 can be formed on the substrate 1604 using known semiconductor fabrication techniques, in a similar manner as the semiconductor fins 102 and substrate 104 discussed with respect to FIG. 1. In some embodiments of the invention, a hard mask 1606 is formed over the semiconductor fins 1602. The hard mask 1606 can be formed in a similar manner as the hard mask 106.

As further depicted in FIG. 16, the semiconductor structure 1600 can include a bottom source/drain 1608 and a dielectric liner 1610. The bottom source/drain 1608 and the dielectric liner 1610 can be formed in a similar manner as the bottom source/drain 108 and the dielectric liner 110 discussed with respect to FIG. 1.

Figure 17:
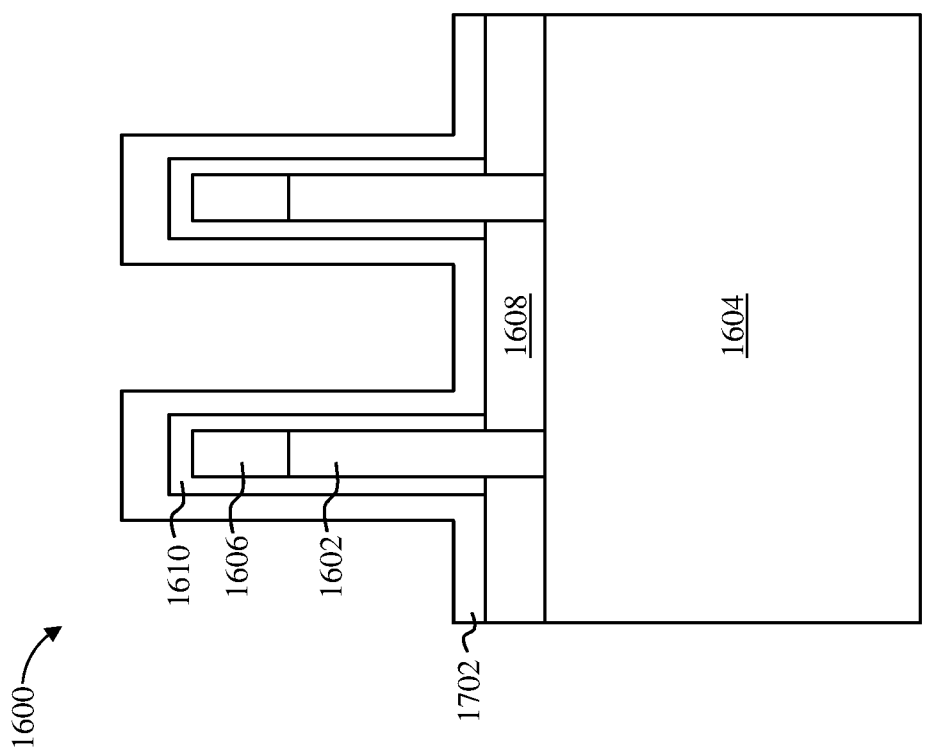
FIG. 17 depicts a cross-sectional view of the semiconductor structure after an intermediate operation of a method of fabricating a semiconductor device according to one or more embodiments of the invention.

FIG. 17 depicts a cross-sectional view of the partially fabricated semiconductor structure 1600 after an intermediate operation of a method of fabricating a semiconductor device according to one or more embodiments of the invention. As depicted in FIG. 17, a bottom spacer 1702 can be formed over the dielectric liner 1610. The bottom spacer 1702 can be formed in a similar manner as the bottom spacer 202 discussed previously herein. The bottom spacer 1702 can be formed to a thickness of about 2 to 10 nm, although other thicknesses are within the contemplated scope of the invention. The bottom spacer 1702 can be made of any suitable material, such as, for example, a low-k dielectric, a nitride, silicon nitride, silicon oxide, SiON, SiC, SiOCN, or SiBCN.

Figure 18:
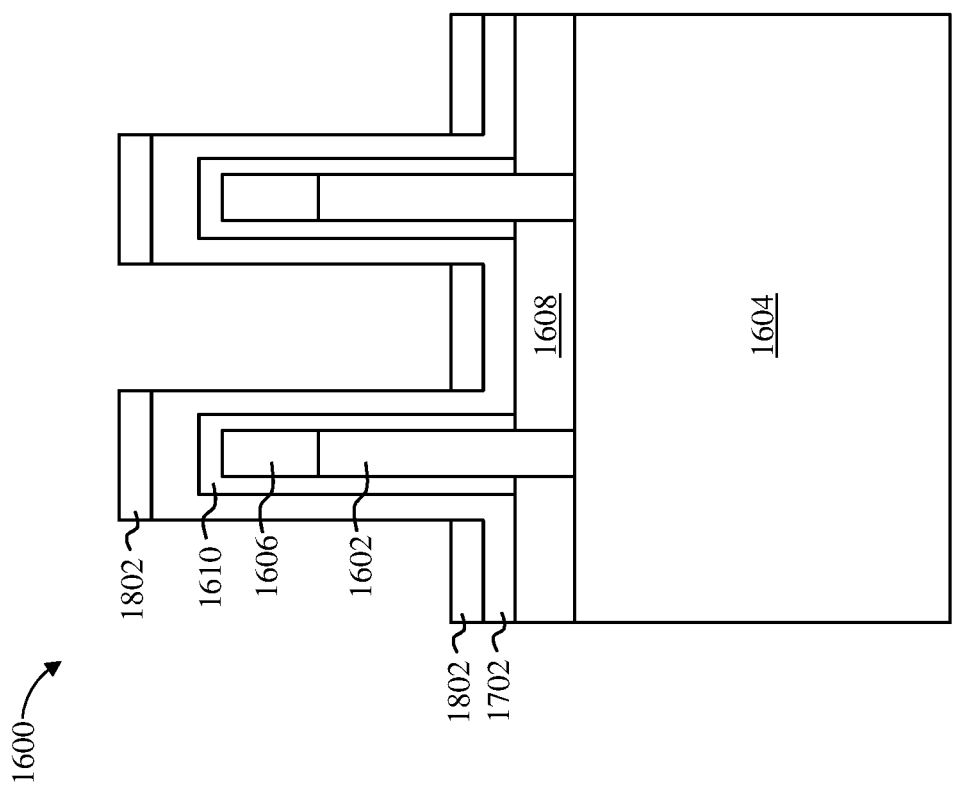
FIG. 18 depicts a cross-sectional view of the semiconductor structure after an intermediate operation of a method of fabricating a semiconductor device according to one or more embodiments of the invention.

FIG. 18 depicts a cross-sectional view of the partially fabricated semiconductor structure 1600 after an intermediate operation of a method of fabricating a semiconductor device according to one or more embodiments of the invention. As depicted in FIG. 18, a dielectric liner 1802 can be formed over the bottom spacer 1702.

In some embodiments of the invention, the dielectric liner 1802 is formed using a CVD, PECVD, UHVCVD, RTCVD, MOCVD, LPCVD, LRPCVD, ALD, PVD, chemical solution deposition, or other like process. In some embodiments of the invention, dielectric material can be conformally deposited over the semiconductor structure 1600 using, for example, CVD or ALD. The dielectric liner 1802 can be made of any suitable material, such as, for example, a low-k dielectric, a nitride, silicon nitride, silicon oxide, SiON, SiC, SiOCN, or SiBCN. In some embodiments of the invention, the dielectric liner 1802 is made of $SiO_2$. The dielectric liner 1802 can be formed to a thickness of about 1 to 10 nm, for example 2 nm, although other thicknesses are within the contemplated scope of the invention.

In some embodiments of the invention, the dielectric liner 1802 is formed using a directional deposition process, such as a dual oxide deposition, during which more dielectric material is deposited on the horizontal surfaces of the semiconductor structure 1600. In other words, the lateral thickness of the deposited dielectric material can be less than the vertical thickness of the deposited dielectric material. In some embodiments of the invention, portions of the dielectric liner 1802 can be removed to expose sidewalls of the bottom spacer 1702. The dielectric liner 1802 can be partially removed using a wet etch, a dry etch, or a combination of sequential wet and/or dry etches. In some embodiments of the invention, portions of the dielectric liner 1802 are removed using a buffered hydrofluoric acid etch.

Figure 19:
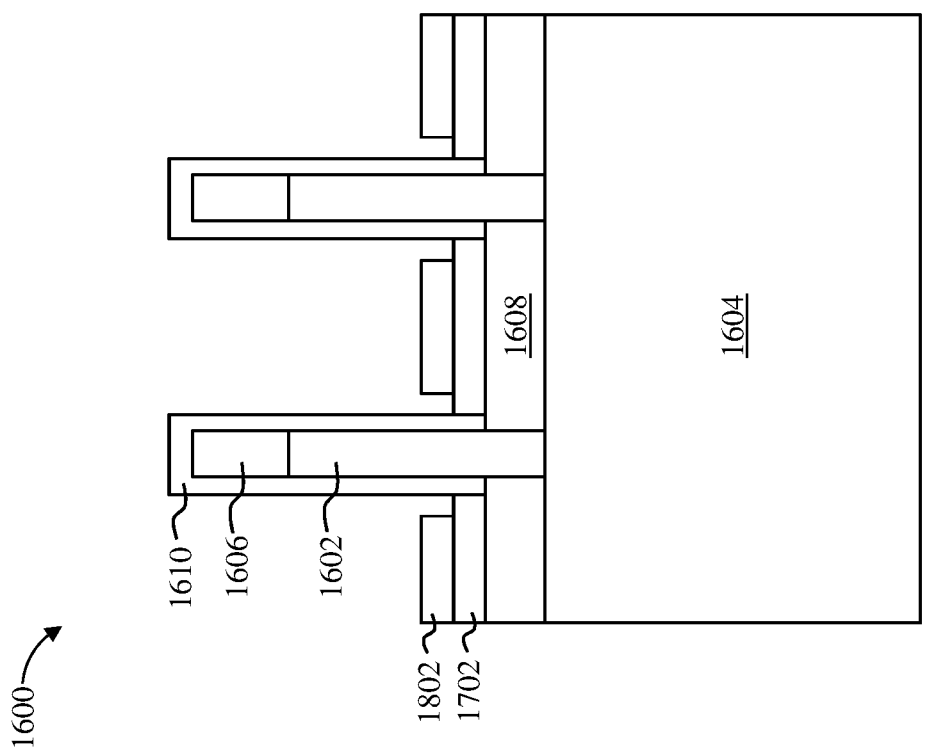
FIG. 19 depicts a cross-sectional view of the semiconductor structure after an intermediate operation of a method of fabricating a semiconductor device according to one or more embodiments of the invention.

FIG. 19 depicts a cross-sectional view of the partially fabricated semiconductor structure 1600 after an intermediate operation of a method of fabricating a semiconductor device according to one or more embodiments of the invention. As depicted in FIG. 19, exposed portions of the bottom spacer 1702 can be removed. The bottom spacer 1702 can be partially removed using a wet etch, a dry etch, or a combination of sequential wet and/or dry etches. In some embodiments of the invention, the bottom spacer 1702 is removed selective to the dielectric liner 1610 and/or the dielectric liner 1802. For example, SiBCN and SiN can be etched selective to $SiO_2$ using a $H_3PO_4$ etch.

Figure 20:
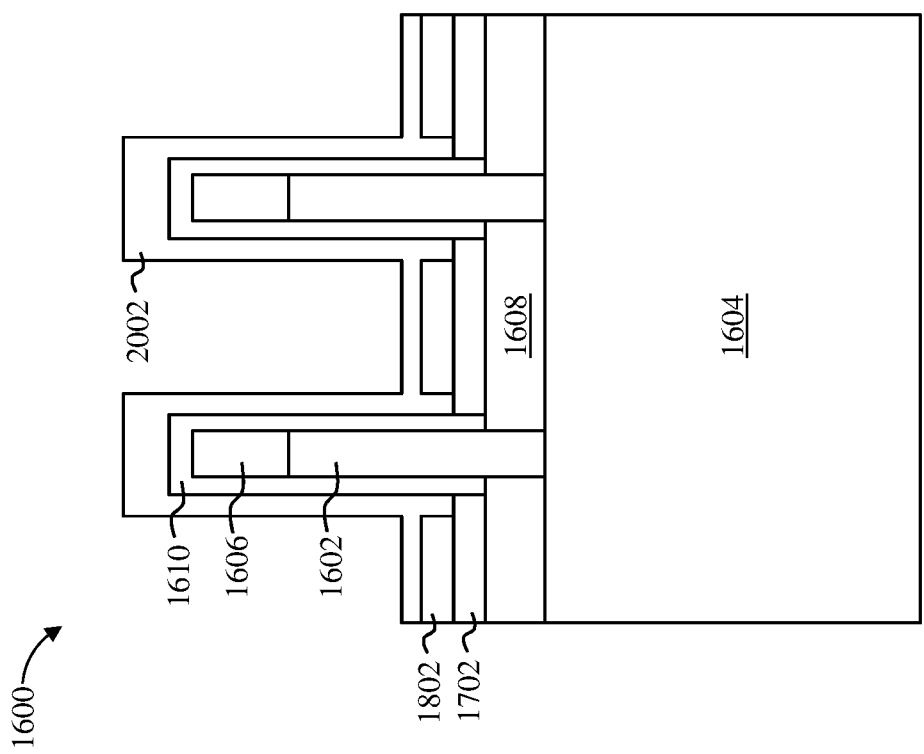
FIG. 20 depicts a cross-sectional view of the semiconductor structure after an intermediate operation of a method of fabricating a semiconductor device according to one or more embodiments of the invention.

FIG. 20 depicts a cross-sectional view of the partially fabricated semiconductor structure 1600 after an intermediate operation of a method of fabricating a semiconductor device according to one or more embodiments of the invention. As depicted in FIG. 20, an oxide liner 2002 can be deposited over the semiconductor structure 1600. In some embodiments of the invention, the dielectric liner 1802 and the oxide liner 2002 are a same material, and merge into a single dielectric region.

Figure 21:
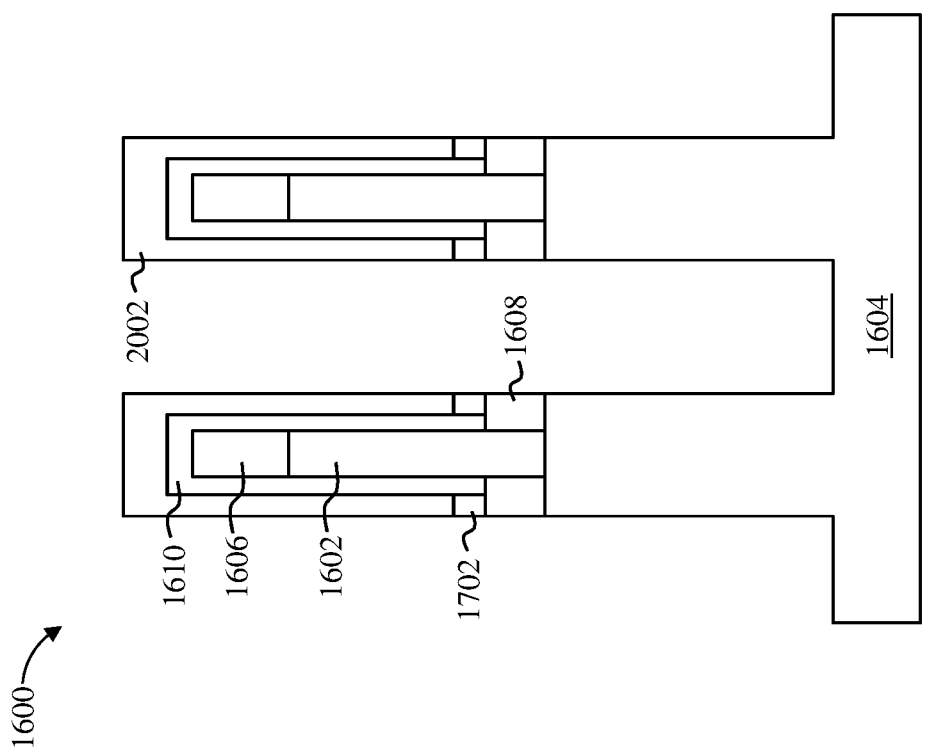
FIG. 21 depicts a cross-sectional view of the semiconductor structure after an intermediate operation of a method of fabricating a semiconductor device according to one or more embodiments of the invention.

FIG. 21 depicts a cross-sectional view of the partially fabricated semiconductor structure 1600 after an intermediate operation of a method of fabricating a semiconductor device according to one or more embodiments of the invention. As depicted in FIG. 21, exposed portions of the oxide liner 2002, bottom spacer 1702, dielectric liner 1802, and bottom source/drain 1608 can be removed. The oxide liner 2002, bottom spacer 1702, dielectric liner 1802, and bottom source/drain 1608 can be removed using, for example, a wet etch, a dry etch, or a combination of sequential wet and/or dry etches. In some embodiments of the invention, the exposed portions of the oxide liner 2002, bottom spacer 1702, dielectric liner 1802, and bottom source/drain 1608 can be removed using a RIE to expose a surface of the substrate 1604. In some embodiments of the invention, the exposed surface of the substrate 1604 is recessed to define a shallow trench isolation (STI) region.

Figure 22:
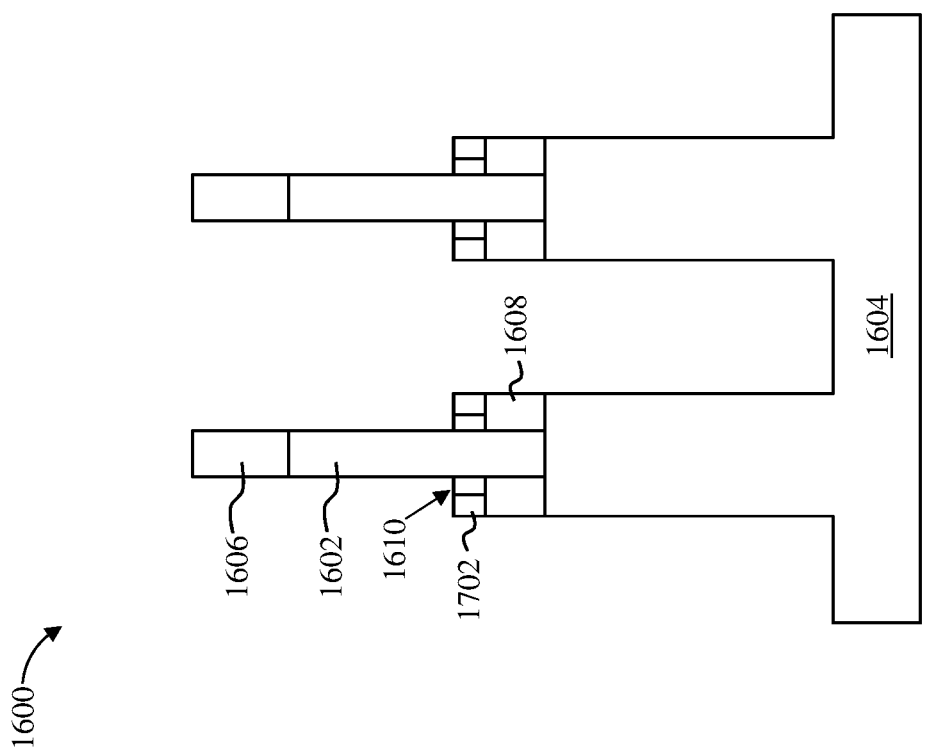
FIG. 22 depicts a cross-sectional view of the semiconductor structure after an intermediate operation of a method of fabricating a semiconductor device according to one or more embodiments of the invention.

FIG. 22 depicts a cross-sectional view of the partially fabricated semiconductor structure 1600 after an intermediate operation of a method of fabricating a semiconductor device according to one or more embodiments of the invention. As depicted in FIG. 22, the oxide liner 2002 can be removed and exposed portions of the dielectric liner 1610 can be recessed. In some embodiments of the invention, the oxide liner 2002 and the dielectric liner 1610 are oxide liners that are selectively removed using, for example, a buffered hydrofluoric acid etch.

Figure 23:
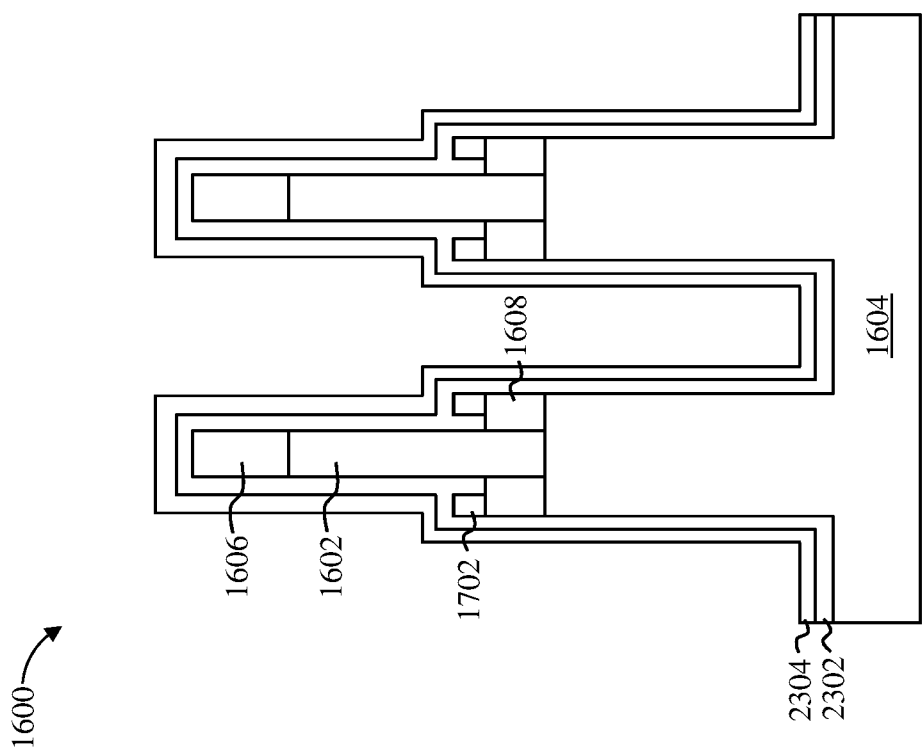
FIG. 23 depicts a cross-sectional view of the semiconductor structure after an intermediate operation of a method of fabricating a semiconductor device according to one or more embodiments of the invention.

FIG. 23 depicts a cross-sectional view of the partially fabricated semiconductor structure 1600 after an intermediate operation of a method of fabricating a semiconductor device according to one or more embodiments of the invention. As depicted in FIG. 23, an oxide liner 2302 and a nitride liner 2304 can be formed over the semiconductor structure 1600. As further depicted in FIG. 23, the oxide liner 2302 and the dielectric liner 1610 can be made of a same material (e.g., $SiO_2$) to define a single oxide liner (labeled simply, oxide liner 2302).

In some embodiments of the invention, the oxide liner 2302 and the nitride liner 2304 are each formed using a CVD, PECVD, UHVCVD, RTCVD, MOCVD, LPCVD, LRPCVD, ALD, PVD, chemical solution deposition, or other like process. In some embodiments of the invention, dielectric material can be conformally deposited over the semiconductor structure 1600 using, for example, CVD or ALD. In some embodiments of the invention, the oxide liner 2302 is formed to a thickness of about 1 to 5 nm, for example 3 nm, although other thicknesses are within the contemplated scope of the invention. In some embodiments of the invention, the nitride liner 2304 is formed to a thickness of about 4 to 10 nm, for example 6 nm, although other thicknesses are within the contemplated scope of the invention.

Figure 24:
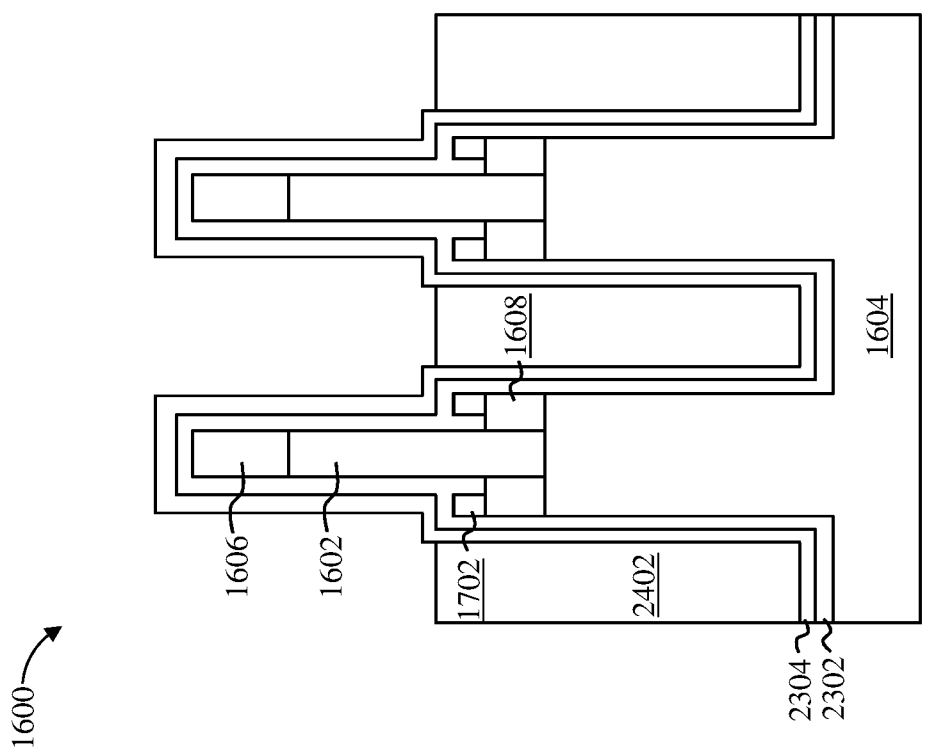
FIG. 24 depicts a cross-sectional view of the semiconductor structure after an intermediate operation of a method of fabricating a semiconductor device according to one or more embodiments of the invention.

FIG. 24 depicts a cross-sectional view of the partially fabricated semiconductor structure 1600 after an intermediate operation of a method of fabricating a semiconductor device according to one or more embodiments of the invention. As depicted in FIG. 24, an STI region 2402 is formed over the nitride liner 2304. The STI region 2402 can be formed using any suitable isolation material, such as, for example, silicon nitride, silicon oxide, or SiOCN. In some embodiments of the invention, the STI region 2402 is formed using a bulk oxide deposition process. The STI region 2402 can be recessed below a surface of the nitride liner 2304. In some embodiments of the invention, the STI region 2402 is further recessed below a surface of the oxide liner 2302 and the bottom spacer 1702.

Figure 25:
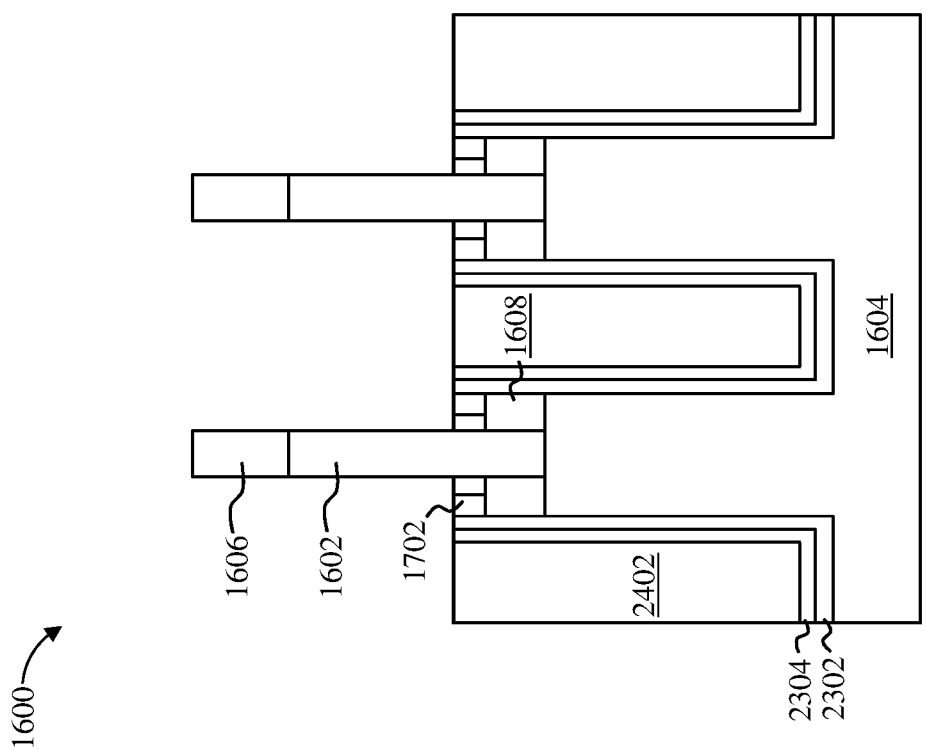
FIG. 25 depicts a cross-sectional view of the semiconductor structure after an intermediate operation of a method of fabricating a semiconductor device according to one or more embodiments of the invention.

FIG. 25 depicts a cross-sectional view of the partially fabricated semiconductor structure 1600 after an intermediate operation of a method of fabricating a semiconductor device according to one or more embodiments of the invention. As depicted in FIG. 25, portions of the nitride liner 2304 can be removed. The nitride liner 2304 can be partially removed using a wet etch, a dry etch, or a combination of sequential wet and/or dry etches. In some embodiments of the invention, the nitride liner 2304 is removed selective to the oxide liner 2302 and/or the STI region 2402. For example, SiBCN and SiN can be etched selective to $SiO_2$ using a $H_3PO_4$ etch.

In some embodiments of the invention, the oxide liner 2302 is recessed to expose sidewalls of the semiconductor fins 1602. The oxide liner 2302 can be recessed using, for example, a wet or dry etch. In some embodiments of the invention, the oxide liner 2302 is removed using a buffered hydrofluoric acid etch.

Figure 26:
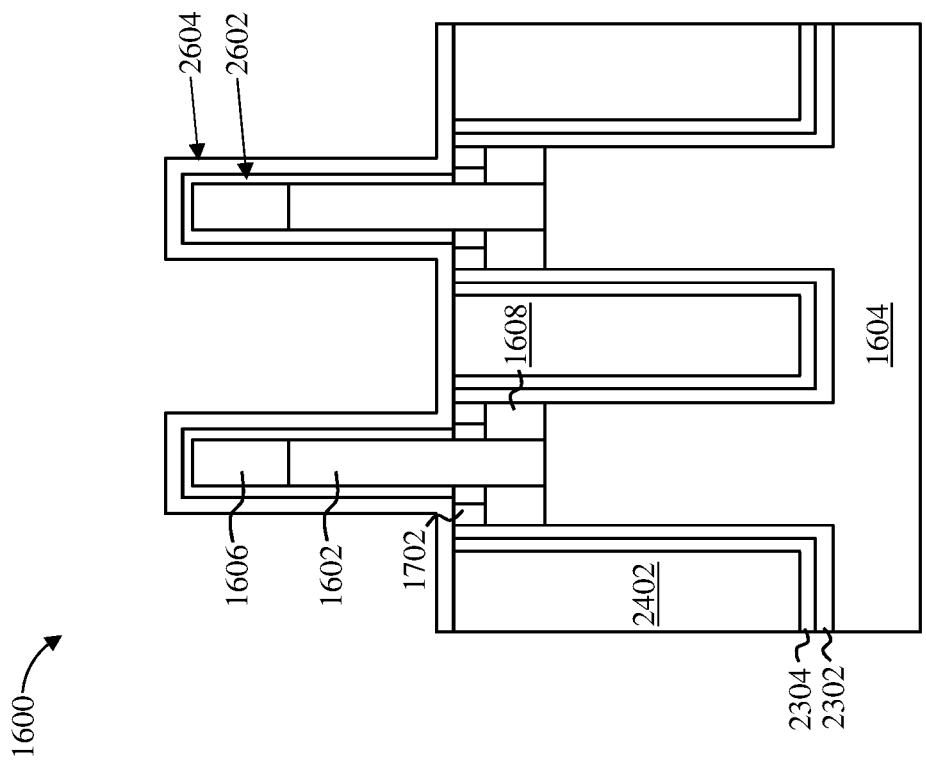
FIG. 26 depicts a cross-sectional view of the semiconductor structure after an intermediate operation of a method of fabricating a semiconductor device according to one or more embodiments of the invention.

FIG. 26 depicts a cross-sectional view of the partially fabricated semiconductor structure 1600 after an intermediate operation of a method of fabricating a semiconductor device according to one or more embodiments of the invention. As depicted in FIG. 26, an interfacial layer 2602 can be formed over the semiconductor fins 1602 and the hard mask 1606. The interfacial layer 2602 can be made of any suitable material, such as, for example, an oxide. The interfacial layer 2602 can be formed using a CVD, PECVD, UHVCVD, RTCVD, MOCVD, LPCVD, LRPCVD, ALD, PVD, chemical solution deposition, or other like process. In some embodiments of the invention, the interfacial layer 2602 can be conformally deposited over the semiconductor structure 1600 using, for example, CVD or ALD. In some embodiments of the invention, the interfacial layer 2602 is conformally deposited over the semiconductor structure 1600 and then patterned to the sidewalls of the semiconductor fins 1600 using, for example, a ME. In some embodiments of the invention, the interfacial layer 2602 is formed to a thickness of about 1 to 5 nm, for example 3 nm, although other thicknesses are within the contemplated scope of the invention.

In some embodiments of the invention, a high-k dielectric 2604 can be formed over the interfacial layer 2602. The high-k dielectric 2604 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric 2604 can have a thickness of about 0.5 nm to about 4 nm. In some embodiments of the invention, the high-k dielectric 2604 includes hafnium oxide and has a thickness of about 1 nm, although other thicknesses are within the contemplated scope of the invention.

In some embodiments of the invention, the semiconductor device 1600 can be completed in a similar manner as discussed with reference to the semiconductor device 100 in FIGS. 15A and 15B. For example, the hard mask 1606 can be removed and replaced with a top source/drain region (not depicted). In some embodiments of the invention, a gate (not depicted) can be formed over a channel region of the semiconductor fins 1602. In some embodiments of the invention, a top spacer (not depicted) can be formed between the top source/drain region and the gate.

Figure 27:
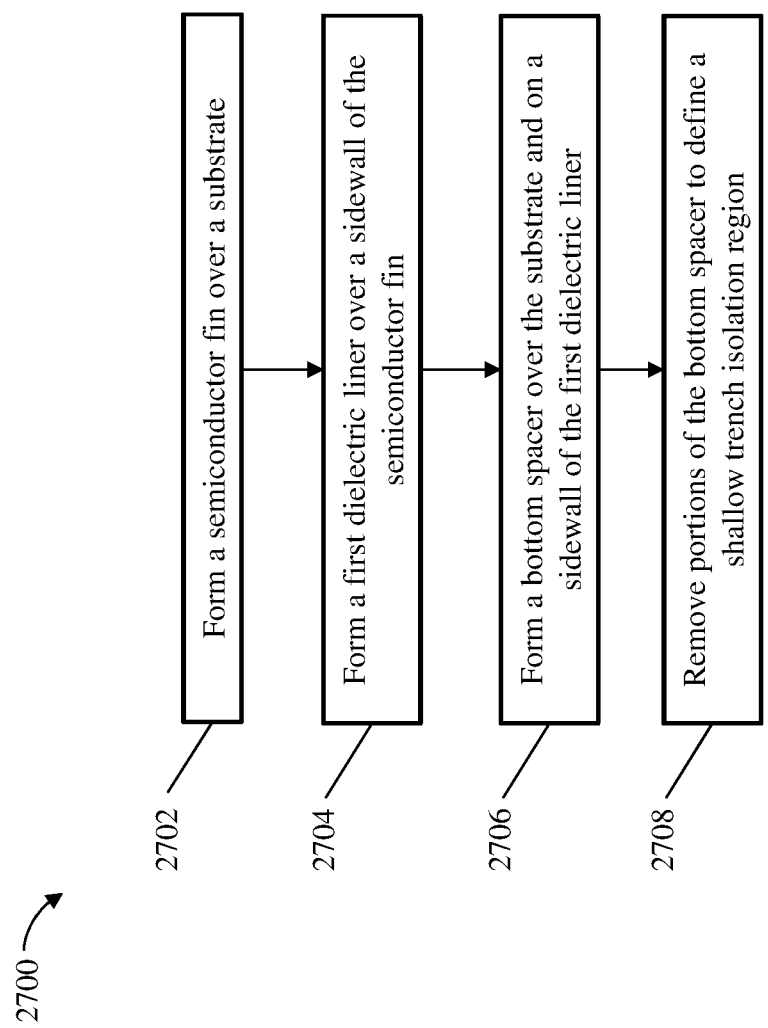
FIG. 27 depicts a flow diagram illustrating a method according to one or more embodiments of the invention.

FIG. 27 depicts a flow diagram 2700 illustrating a method for forming a semiconductor device according to one or more embodiments of the invention. As shown at block 2702, a semiconductor fin is formed over a substrate. The semiconductor fin can be formed in a similar manner as the semiconductor fins 102 discussed previously herein with respect to FIG. 1A.

At block 2704, a first dielectric liner is formed over a sidewall of the semiconductor fin. The first dielectric liner can be formed in a similar manner as the dielectric liner 110 discussed previously herein with respect to FIG. 1A.

At block 2706, a bottom spacer is formed over the substrate and on a sidewall of the first dielectric liner. The first dielectric liner can be positioned between the semiconductor fin and the bottom spacer. The bottom spacer be formed in a similar manner as the bottom spacer 202 discussed previously herein with respect to FIG. 2A.

At block 2708, portions of the bottom spacer are removed to define a shallow trench isolation region.

The method can further include forming a bottom source/drain on the substrate. The method can include forming a second dielectric liner on the bottom spacer. A vertical thickness of the second dielectric liner can be greater than a lateral thickness of the second dielectric liner. Portions of the second dielectric liner can be removed to expose a sidewall of the bottom spacer. Exposed portions of the bottom spacer can be removed to expose the sidewall of the first dielectric liner. A conductive gate can be formed over the bottom spacer and over a channel region of the semiconductor fin. A top spacer can be formed over the conductive gate. A top source/drain can be formed on a top surface of the semiconductor fin.

Figure 28:
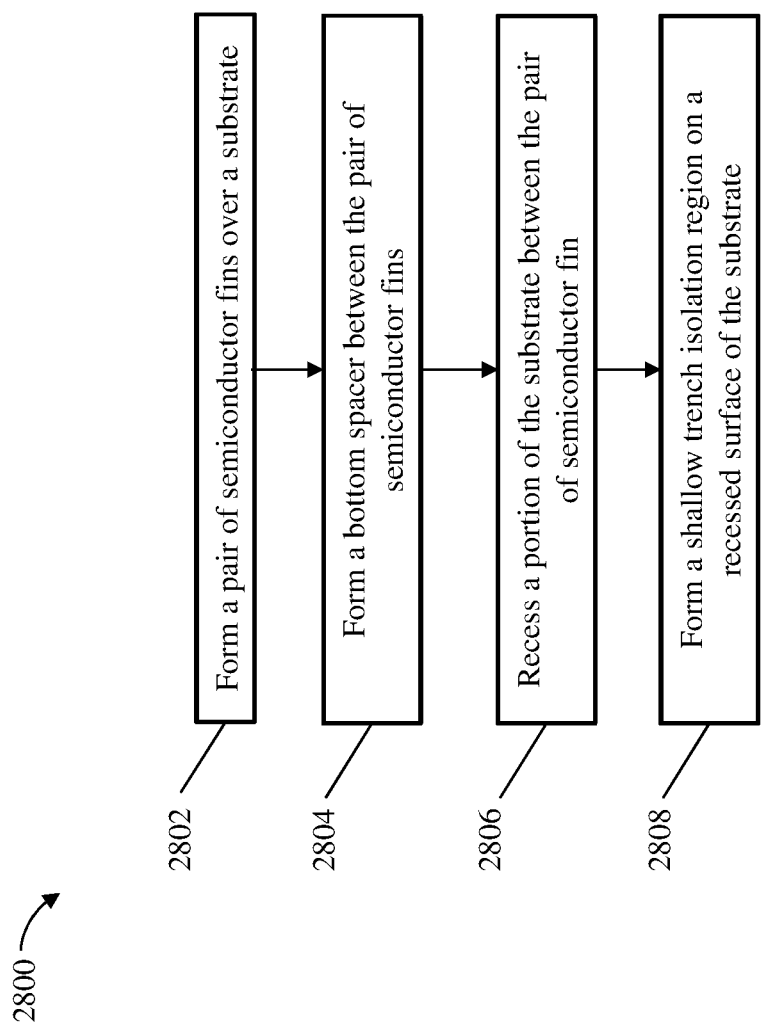
FIG. 28 depicts a flow diagram illustrating a method according to one or more embodiments of the invention.

FIG. 28 depicts a flow diagram 2800 illustrating a method for forming a semiconductor device according to one or more embodiments of the invention. As shown at block 2802, a pair of semiconductor fins is formed over a substrate. The pair of semiconductor fins can be formed in a similar manner as the semiconductor fins 1602 discussed previously herein with respect to FIG. 16.

At block 2804, a bottom spacer is formed between the pair of semiconductor fins. The bottom spacer can be positioned adjacent to sidewalls of the pair of semiconductor fins, in a similar manner as the bottom spacer 1702 discussed previously herein with respect to FIG. 17.

At block 2806, a portion of the substrate between the pair of semiconductor fins is recessed. The substrate can be recessed below a bottommost surface of the bottom spacer.

At block 2808, a shallow trench isolation region is formed on a recessed surface of the substrate. The shallow trench isolation region can be formed in a similar manner as the STI region 2402 discussed previously herein with respect to FIG. 24.

The method can further include forming a first dielectric liner between the pair of semiconductor fins and the bottom spacer. A bottom source/drain can be formed on the substrate. A second dielectric liner can be formed on the bottom spacer. A vertical thickness of the second dielectric liner can be greater than a lateral thickness of the second dielectric liner. Portions of the second dielectric liner can be removed to expose a sidewall of the bottom spacer. Exposed portions of the bottom spacer can be removed to expose the sidewall of the first dielectric liner.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a pair of semiconductor fins over a substrate;

forming a bottom source or drain on the substrate;

forming a first dielectric liner directly on sidewalls of the pair of semiconductor fins, the first dielectric liner on a surface of the bottom source or drain;

forming a bottom spacer between the pair of semiconductor fins on the surface of the bottom source or drain, the bottom spacer directly adjacent to sidewalls of the first dielectric liner, wherein a topmost surface of the bottom spacer is below a topmost surface of the pair of semiconductor fins;

removing a first portion of the bottom spacer and a portion of the bottom source or drain and recessing the substrate between the pair of semiconductor fins, the substrate recessed below a bottommost surface of a second portion of the bottom spacer and a bottommost surface of the source or drain; and forming a shallow trench isolation (STI) region on the recessed surface of the substrate while the second portion of the bottom spacer is on the surface of the bottom source or drain such that the bottom spacer and the STI region are formed in a spacer prior to STI process integration.

2. The method of claim 1 further comprising forming a second dielectric liner on the bottom spacer.

3. The method of claim 2, wherein a vertical thickness of the second dielectric liner is greater than a lateral thickness of the second dielectric liner.

* * * * *